United States Patent
Min et al.

(10) Patent No.: US 12,218,293 B2
(45) Date of Patent: Feb. 4, 2025

(54) PIXEL MODULE EMPLOYING MOLDING MEMBER HAVING MULTI-MOLDING LAYER AND DISPLAYING APPARATUS HAVING THE SAME

(71) Applicant: SEOUL VIOSYS CO., LTD., Gyeonggi-do (KR)

(72) Inventors: Junhong Min, Gyeonggi-do (KR); Ik Kyu You, Gyeonggi-do (KR)

(73) Assignee: SEOUL VIOSYS CO., LTD., Ansan-si (KR)

(*) Notice: Subject to any disclaimer, the term of this patent is extended or adjusted under 35 U.S.C. 154(b) by 430 days.

(21) Appl. No.: 17/666,202

(22) Filed: Feb. 7, 2022

(65) Prior Publication Data
US 2022/0262993 A1 Aug. 18, 2022

Related U.S. Application Data

(60) Provisional application No. 63/150,806, filed on Feb. 18, 2021.

(51) Int. Cl.
*H01L 33/58* (2010.01)
*H01L 25/075* (2006.01)

(52) U.S. Cl.
CPC .......... *H01L 33/58* (2013.01); *H01L 25/0753* (2013.01); *H01L 2933/0058* (2013.01)

(58) Field of Classification Search
CPC ................ H01L 33/58; H01L 25/0753; H01L 2933/0058
See application file for complete search history.

(56) References Cited

U.S. PATENT DOCUMENTS

| | | | |
|---|---|---|---|
| 2016/0197310 A1* | 7/2016 | Kubota | H05B 33/04 313/512 |
| 2020/0083397 A1* | 3/2020 | Lee | H01L 33/56 |
| 2020/0303605 A1* | 9/2020 | Jang | H01L 33/56 |
| 2021/0343782 A1* | 11/2021 | Cha | H01L 25/167 |
| 2021/0376188 A1* | 12/2021 | You | H01L 33/0095 |
| 2022/0293832 A1* | 9/2022 | Min | B29D 11/00788 |
| 2023/0335691 A1* | 10/2023 | Park | G09F 9/33 |

FOREIGN PATENT DOCUMENTS

| | | |
|---|---|---|
| JP | 2009096868 A | 5/2009 |
| JP | 2010015070 A | 1/2010 |
| KR | 1020070108556 A | 11/2007 |
| KR | 1020190026617 A | 3/2019 |
| WO | WO 2015019532 * | 2/2015 |

OTHER PUBLICATIONS

Shu-Mei Yang et al., Angular Color Variation in Micron-Scale Light-Emitting Diode Arrays, Optics Express, Aug. 5, 2019, pp. A1308-A1323, vol. 27(16), Optica Publishing Group, Optical Society of America.

Fangwang Gou, et al. Angular Color Shift of Micro-LED Displays, Optics Express, Jun. 10, 2019, pp. A746-A757, vol. 27(12), Optical Society of America.

English translation of International Search Report issued in corresponding International Application No. PCT/KR2022/002370, mailed Jun. 7, 2022, 3 pages.

* cited by examiner

*Primary Examiner* — Mary Ellen Bowman
(74) *Attorney, Agent, or Firm* — Perkins Coie LLP

(57) ABSTRACT

A pixel module includes a circuit board, a plurality of unit pixels arranged on the circuit board, and a molding member covering the plurality of unit pixels. The molding member includes a light diffusion layer and a black molding layer covering the light diffusion layer.

20 Claims, 13 Drawing Sheets

COMPARATIVE EXAMPLE 1

COMPARATIVE EXAMPLE 2

COMPARATIVE EXAMPLE 3

INVENTIVE EXAMPLE 1

INVENTIVE EXAMPLE 2

PIXEL MODULE EMPLOYING MOLDING MEMBER HAVING MULTI-MOLDING LAYER AND DISPLAYING APPARATUS HAVING THE SAME

CROSS-REFERENCE OF RELATED APPLICATIONS AND PRIORITY

The Present Application is a non-provisional application which claims priority to and benefit of U.S. Provisional Application Ser. No. 63/150,806 filed Feb. 18, 2021, the disclosure of which is incorporated by reference as if fully set forth herein.

TECHNICAL FIELD

Exemplary embodiments relate to a displaying apparatus, and more particularly, to a pixel module employing a molding member having a multi-molding layer and a displaying apparatus having the same.

BACKGROUND

Light emitting devices are semiconductor devices using light emitting diodes which are inorganic light sources, and are used in various technical fields such as displaying apparatuses, automobile lamps, general lighting, and the like. Light emitting diodes have advantages such as longer lifespan, lower power consumption, and quicker response, than conventional light sources, and thus, the light emitting diodes have been replacing conventional light sources.

Conventional light emitting diodes have been generally used as backlight light sources in displaying apparatuses. Recently, displaying apparatuses that directly realize images using the light emitting diodes have been developed and are referred to as micro LED displays.

In general, a displaying apparatus realizes various colors using a mixed color of blue, green, and red. The displaying apparatus includes a plurality of pixels in order to realize various images, each including sub-pixels corresponding to one of blue, green, and red light. As such, a color of a certain pixel is typically determined based on the colors of the sub-pixels, so that images can be realized through the combination of such pixels.

In a case of the micro LED display, a micro LED is arranged on a two-dimensional plane corresponding to each sub pixel, and, accordingly, a large number of micro LEDs are arranged on a single substrate. A micro LED is small, for example, 200 μm or less, such as 100 μm or less, and due to these small sizes specific technical considerations are considered. In particular, in handling the light emitting diodes having small sizes, such as directly mounting the light emitting diodes on a display panel, specific technical considerations may be used.

Meanwhile, light interference between adjacent sub-pixels makes it difficult to achieve high color reproducibility and high contrast. Moreover, a color deviation depending on a viewing angle may be avoided.

SUMMARY

Exemplary embodiments provide a pixel module capable of reducing a color deviation depending on a viewing angle, and a displaying apparatus having the same.

Exemplary embodiments provide a pixel module capable of preventing light interference to achieve high color reproducibility, and a displaying apparatus having the same.

A pixel module according to one or more exemplary embodiments of the present disclosure includes a circuit board, unit pixels arranged on the circuit board, and a molding member covering the unit pixels. The molding member includes a light diffusion layer and a black molding layer covering the light diffusion layer.

A displaying apparatus according to one or more exemplary embodiments of the present disclosure includes a panel substrate and a plurality of pixel modules disposed on the panel substrate. Each of the pixel modules includes a circuit board, unit pixels arranged on the circuit board, and a molding member covering the unit pixels. The molding member includes a light diffusion layer and a black molding layer covering the light diffusion layer.

According to one or more embodiments of the present disclosure, a pixel module includes a circuit board, a plurality of unit pixels arranged on the circuit board, and a molding member covering the plurality of unit pixels. The molding member includes a light diffusion layer and a black molding layer covering the light diffusion layer such that the molding member is disposed between and on or above the plurality of unit pixels. A first thickness of the light diffusion layer disposed between the plurality of unit pixels is different from a second thickness of the light diffusion layer disposed on or above the plurality of unit pixels.

In at least one variant, the light diffusion layer includes a transparent matrix having light diffusion particles dispersed therein and the light diffusion particles include silica or $TiO_2$ particles.

In another variant, the black molding layer includes a light absorbing material in a matrix. In another variant, the light absorbing material include carbon black. The carbon black is coated on surfaces of organic or inorganic particles dispersed in the matrix of the black molding layer.

In another variant, the inorganic particles dispersed in the matrix of the black molding layer include silica or $TiO_2$. The black molding layer includes a plurality of layers having different concentrations of the light absorbing material.

In another variant, the plurality of layers further includes a first layer and a second layer. The first layer has a higher concentration of light absorbing material than the second layer and the second layer is disposed further apart from the light diffusion layer than the first layer is.

In another variant, a concentration of the light absorbing material in the black molding layer is gradually decreased from the light diffusion layer in a thickness direction of the black molding layer.

In another variant, the molding member further includes a transparent molding layer on which the light diffusion layer is disposed and the black molding layer is disposed on the light diffusion layer. The transparent molding layer is further disposed between the plurality of unit pixels and the light diffusion layer.

In another variant, the light diffusion layer and the black molding layer are disposed in an upper region of two neighboring unit pixels among the plurality of unit pixels and in a region between the two neighboring unit pixels. The light diffusion layer and the black molding layer in the upper region are configured to be thinner than the light diffusion layer and the black molding layer in the region between the two neighboring unit pixels.

In another variant, a unit pixel of the plurality of unit pixels comprises at least three light emitting devices disposed adjacent to one another and the at least three light emitting devices are arranged side by side.

In another variant, the unit pixel of the plurality of unit pixels further comprises a step adjustment layer disposed between the at least three light emitting devices. A thickness of the light diffusion layer, a thickness of the black molding layer, or both thicknesses of the light diffusion layer and the black molding layer vary along a lateral direction of the circuit board.

In another variant, the black molding layer is arranged in an upper region of a selected unit pixel of the plurality of unit pixels and in a region between the selected unit pixel and a neighboring unit pixel, and the thickness of the black molding layer is smaller than the black molding layer arranged in the region between the selected unit pixel and the neighboring unit pixel.

In another variant, the pixel module further includes a protection layer, and a plurality of connection electrodes. An upper surface of the protection layer and upper surfaces of the plurality of connection electrodes are flush with one another.

In another variant, the molding member has a thickness within a range of 50 μm to 400 μm.

In another variant, the molding member is formed through a vacuum lamination technique using a film including the light diffusion layer and the black molding layer. A viewing angle of the pixel module is less than 120 degrees, and a maximum value of Δu'v' in a range of +−45 degree, indicative of color deviation of the pixel module, does not exceed 0.01.

According to one or more embodiments of the present disclosure, a displaying apparatus, includes a panel substrate, and a plurality of pixel modules disposed on the panel substrate. Each of the pixel modules includes a circuit board, a plurality of unit pixels arranged on the circuit board, and a molding member covering the plurality of unit pixels such that the molding member is disposed between and on or above the plurality of unit pixels. The molding member includes a light diffusion layer and a black molding layer covering the light diffusion layer and a first thickness of the light diffusion layer disposed between the plurality of unit pixels is different from a second thickness of the light diffusion layer disposed on or above the plurality of unit pixels.

DESCRIPTION OF DRAWINGS

FIG. 10A illustrates forming a light diffusion layer and a black molding layer;

FIG. 10B illustrates disposing unit pixels on a circuit board; and

FIG. 10C illustrates covering the unit pixels with the light diffusion layer and the black molding layer through a vacuum lamination process.

FIG. 11A is a graph illustrating Comparative Example 1;

FIG. 11B is a graph illustrating Comparative Example 2;

FIG. 11C is a graph illustrating Comparative Example 3;

FIG. 11D is a graph illustrating Inventive Example 1; and

FIG. 11E is a graph illustrating Inventive Example 2.

DETAILED DESCRIPTION OF ILLUSTRATED EMBODIMENTS

Figure 1:
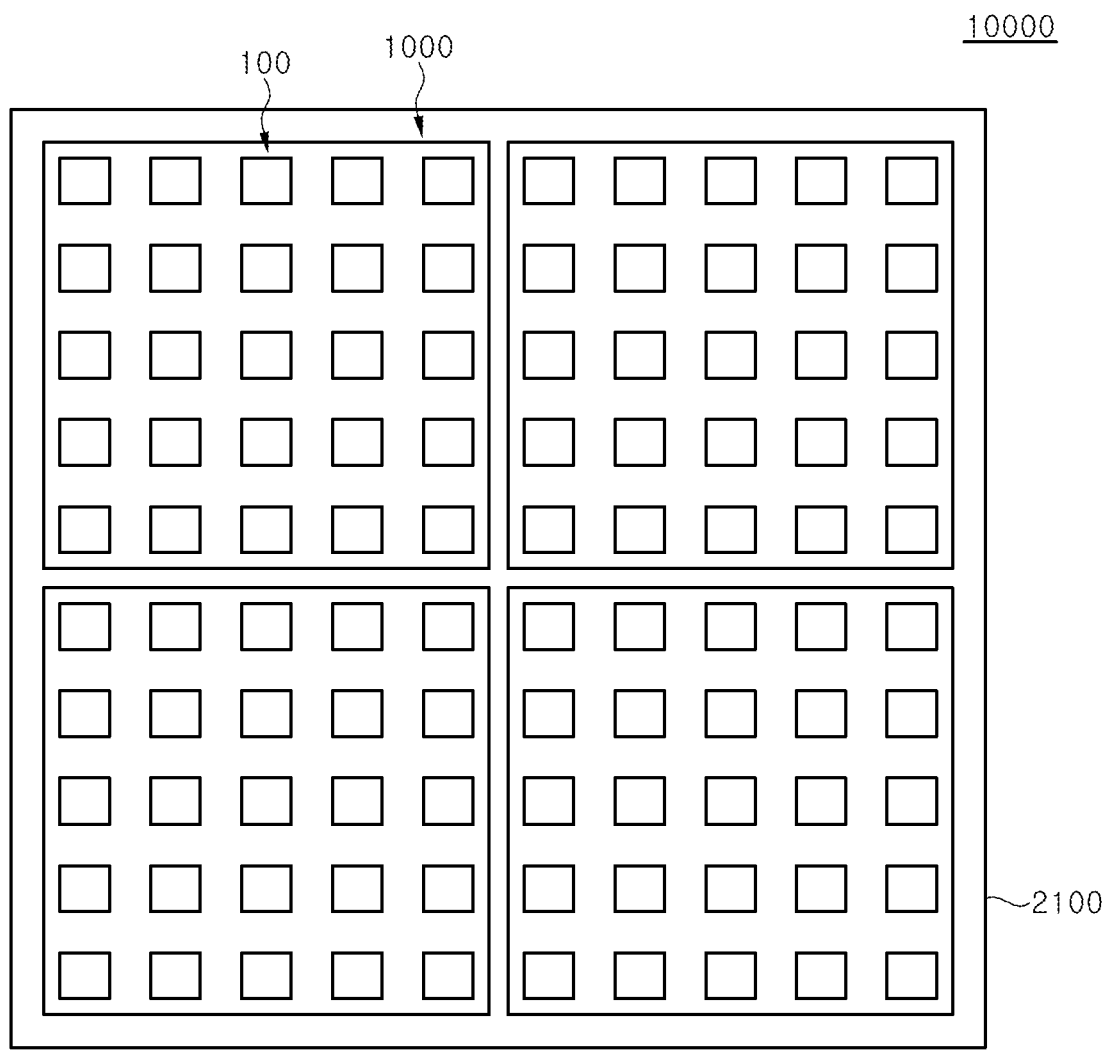
FIG. 1 is a schematic plan view illustrating a displaying apparatus according to an exemplary embodiment.

Hereinafter, exemplary embodiments of the present disclosure will be described in detail with reference to the accompanying drawings. The following exemplary embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

A pixel module according to one or more exemplary embodiments of the present disclosure includes a circuit board, unit pixels arranged on the circuit board, and a molding member covering the unit pixels. The molding member includes a light diffusion layer and a black molding layer covering the light diffusion layer.

In at least one variant, the light diffusion layer may include silica or $TiO_2$ particles in a transparent matrix. The black molding layer may include a light absorbing material in a matrix. Furthermore, the light absorbing material may include carbon black. The carbon black may be coated on surfaces of organic or inorganic particles. The inorganic particles may include silica or $TiO_2$.

In an exemplary embodiment, the black molding layer may include a plurality of layers having different concentrations of the light absorbing material.

A layer with a higher concentration of light absorbing material may be disposed further apart from the light diffusion layer.

In another exemplary embodiment, a concentration of the light absorbing material in the black molding layer may be gradually decreased from the light diffusion layer in a thickness direction of the black molding layer.

The molding member may further include a transparent molding layer disposed between the unit pixel and the light diffusion layer.

The unit pixel may include at least three light emitting devices disposed adjacent to one another.

Furthermore, the unit pixel may further include a step adjustment layer disposed between the light emitting devices.

A thickness of at least one of the light diffusion layer and the black molding layer may vary along a lateral direction of the circuit board.

The black molding layer may have a smaller thickness in an upper region of the unit pixel than in a region between the unit pixels.

An upper surface of the protection layer and upper surfaces of the connection electrodes may be flush with one another. The molding member may have a thickness within a range of 50 µm to 400 µm.

Furthermore, the molding member may be formed through a vacuum lamination technique using a film including the light diffusion layer and the black molding layer.

The pixel module may have a viewing angle of 120 degrees or less, and a maximum Δu'v' may not exceed 0.01 in a range of +−45 degrees.

A displaying apparatus according to one or more exemplary embodiments of the present disclosure includes a panel substrate and a plurality of pixel modules disposed on the panel substrate. Each of the pixel modules includes a circuit board, unit pixels arranged on the circuit board, and a molding member covering the unit pixels. The molding member includes a light diffusion layer and a black molding layer covering the light diffusion layer.

The molding member may further include a transparent molding layer disposed between the unit pixel and the light diffusion layer.

Hereinafter, exemplary embodiments of the present disclosure will be described in more detail with reference to the accompanying drawings.

Figure 2:
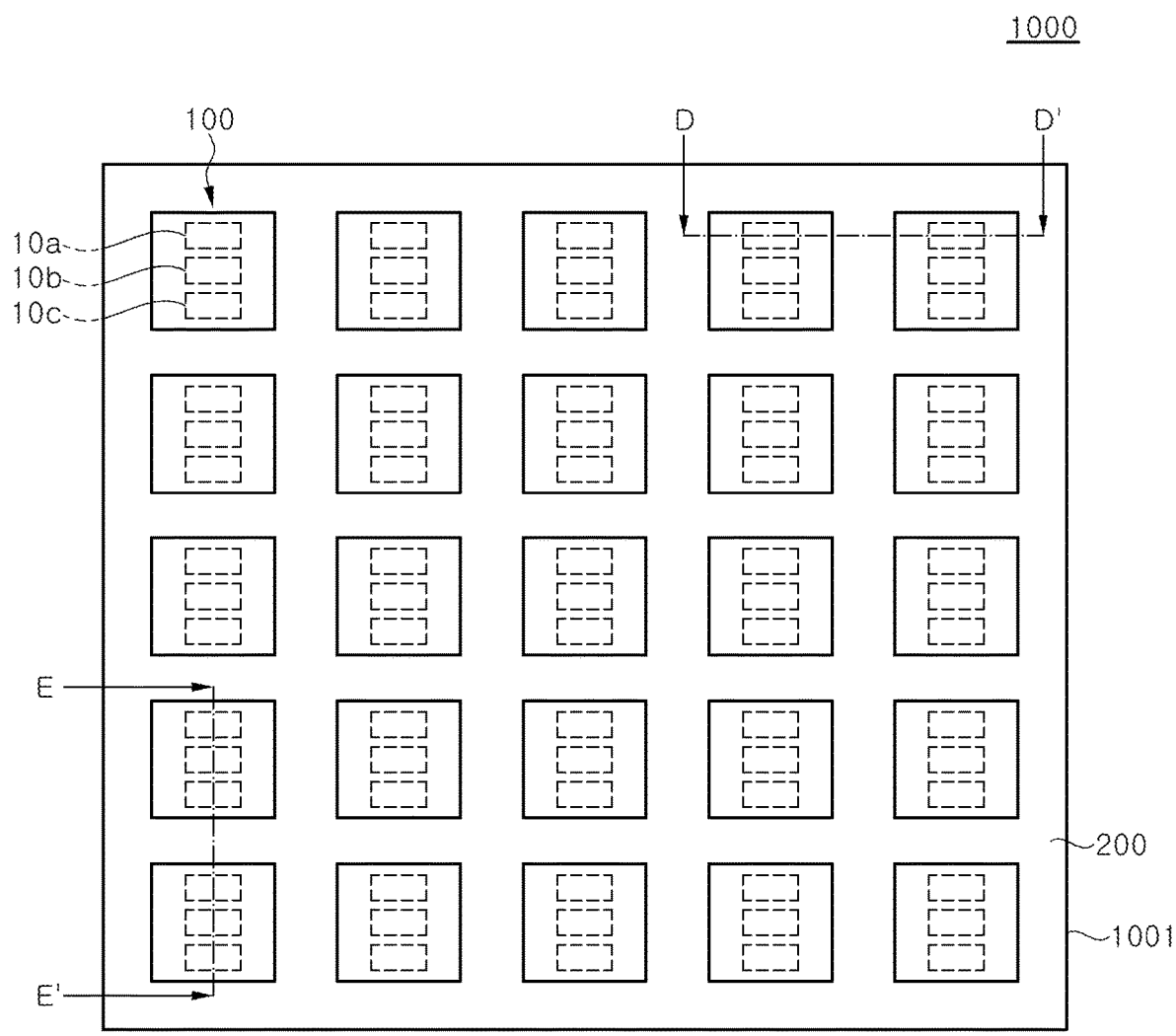
FIG. 2 is a schematic plan view illustrating a pixel module according to an exemplary embodiment.

FIG. 1 is a schematic plan view illustrating a displaying apparatus 10000 according to an exemplary embodiment, and FIG. 2 is a schematic plan view illustrating a pixel module 1000 according to an exemplary embodiment.

Referring to FIGS. 1 and 2, the displaying apparatus 10000 may include a panel substrate 2100 and a plurality of pixel modules 1000.

The displaying apparatus 10000 is not particularly limited, but it may include a virtual reality (VR) displaying apparatus such as a micro LED TV, a smart watch, a VR headset, or an argument reality (AR) displaying apparatus such as augmented reality glasses.

The panel substrate 2100 may include a circuit for a passive matrix driving or active matrix driving manner. In an exemplary embodiment, the panel substrate 2100 may include interconnections and resistors therein, and in another exemplary embodiment, the panel substrate 2100 may include interconnections, transistors, and capacitors. The panel substrate 2100 may also have pads on an upper surface thereof that may be electrically connected to the disposed circuits.

In an exemplary embodiment, the plurality of pixel modules 1000 is arranged on the panel substrate 2100. Each of the pixel modules 1000 may include a circuit board 1001, a plurality of unit pixels 100 disposed on the circuit board 1001, and a molding member 200 covering the unit pixels 100. In another exemplary embodiment, the plurality of unit pixels 100 may be arranged directly on the panel substrate 2100, and the molding member 200 may cover the unit pixels 100.

Each of the unit pixels 100 includes a plurality of light emitting devices 10a, 10b, and 10c. The light emitting devices 10a, 10b, and 10c may emit light of different colors from one another. The light emitting devices 10a, 10b, and 10c in each of the unit pixels 100 may be arranged in a line, as illustrated in FIG. 2. In an exemplary embodiment, the light emitting devices 10a, 10b, and 10c may be arranged in a vertical direction with respect to a display screen on which an image is implemented. However, the inventive concepts are not limited thereto, and the light emitting devices 10a, 10b, and 10c may be arranged in a lateral direction with respect to the display screen on which the image is implemented.

When the light emitting devices 10a, 10b, and 10c are mounted directly on the panel substrate 2100, a mounting failure of the light emitting devices difficult to handle is likely to occur. In this case, since all of the light emitting devices and the panel substrate 2100 need to be discarded, a significant cost loss may occur. On the contrary, by first manufacturing the unit pixel 100 on which the light emitting devices 10a, 10b, and 10c are mounted, and then selecting favorable unit pixels 100 and mounting them on the panel substrate 2100, cost loss may be reduced.

Hereinafter, each element of the displaying apparatus 10000 will be described in detail in an order of the light emitting devices 10a, 10b, and 10c, the unit pixel 100, and the pixel module 1000 disposed in the displaying apparatus 10000.

Figure 3A:
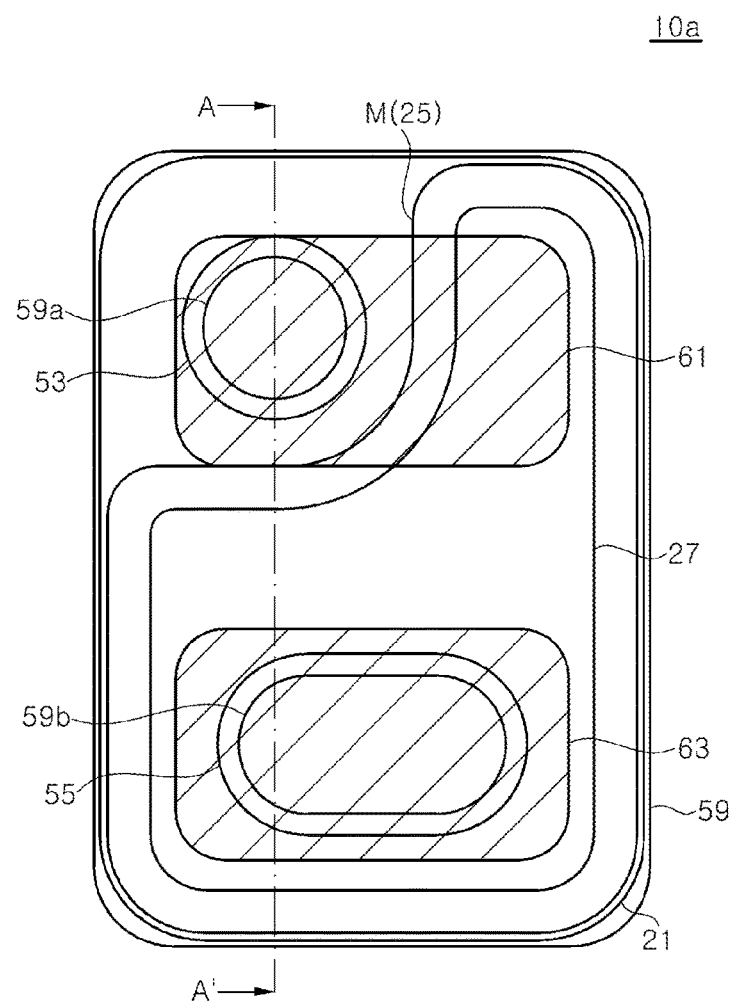
FIG. 3A is a schematic plan view illustrating a light emitting device according to an exemplary embodiment.
Figure 3B:
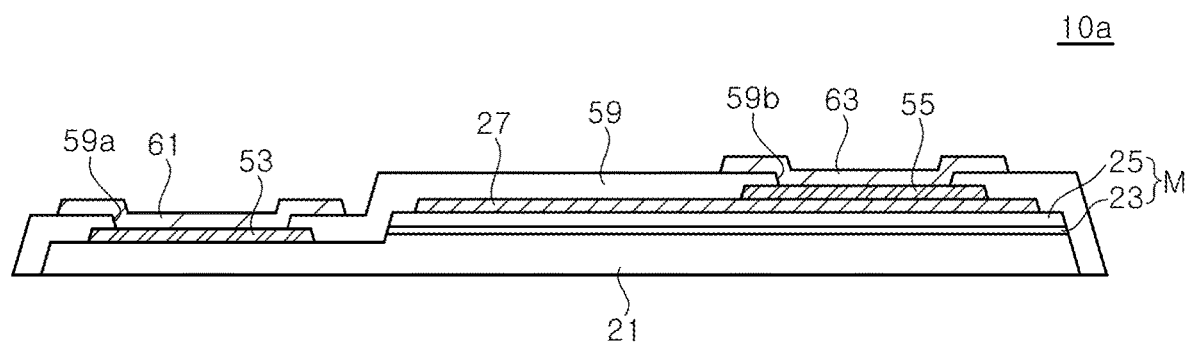
FIG. 3B is a schematic cross-sectional view taken along line A-A' of FIG. 3A.

First, FIG. 3A is a schematic plan view illustrating the light emitting device 10a according to an exemplary embodiment, and FIG. 3B is a schematic cross-sectional view taken along line A-A' of FIG. 3A. Herein, the light emitting device 10a is exemplarily described, but since the light emitting devices 10b and 10c have a substantially similar structure to that of the light emitting device 10a, repeated descriptions thereof will be omitted.

Referring to FIGS. 3A and 3B, the light emitting device 10a may include a light emitting structure including a first conductivity type semiconductor layer 21, an active layer 23, and a second conductivity type semiconductor layer 25, an ohmic contact layer 27, a first contact pad 53, a second contact pad 55, an insulation layer 59, a first electrode pad 61, and a second electrode pad 63.

The light emitting device 10a may have a rectangular shape having a major axis and a minor axis in plan view. For example, a length of the major axis may have a size of about 100 µm or less, and a length of the minor axis may have a size of about 70 µm or less. The light emitting devices 10a, 10b, and 10c may have substantially similar shapes and sizes. The shape of the light emitting device 10a is not limited to the rectangular shape having the major axis length and the minor axis length, but may be another external shape such as a square shape.

The light emitting structure, that is, the first conductivity type semiconductor layer 21, the active layer 23, and the second conductivity type semiconductor layer 25 may be grown on a substrate. The substrate may be one of various substrates that are used to grow semiconductors, such as a gallium nitride substrate, a GaAs substrate, a Si substrate, a sapphire substrate, especially a patterned sapphire substrate. The growth substrate may be separated from the semiconductor layers using a process such as a mechanical grinding, a laser lift off, a chemical lift off process, or the like. However, the inventive concepts are not limited thereto, and, in some exemplary embodiments, a portion of the substrate may remain to constitute at least a portion of the first conductivity type semiconductor layer 21.

In an exemplary embodiment, in a case of the light emitting device 10*a* emitting red light, the semiconductor layers may include aluminum gallium arsenide (AlGaAs), gallium arsenide phosphide (GaAsP), aluminum gallium indium phosphide (AlGaInP), or gallium phosphide (GaP).

In a case of the light emitting device 10*b* emitting green light, the semiconductor layers may include indium gallium nitride (InGaN), gallium nitride (GaN), gallium phosphide (GaP), aluminum gallium indium phosphide (AlGaInP), or aluminum gallium phosphide (AlGaP).

In an exemplary embodiment, in a case of the light emitting device 10*c* emitting blue light, the semiconductor layers may include gallium nitride (GaN), indium gallium nitride (InGaN), or zinc selenide (ZnSe).

The first conductivity type and the second conductivity type have opposite polarities, when the first conductivity type is an n-type, the second conductivity type becomes a p-type, or, when the first conductivity type is a p-type, the second conductivity type becomes an n-type.

The first conductivity type semiconductor layer 21, the active layer 23, and the second conductivity type semiconductor layer 25 may be grown on the substrate in a chamber using a known process such as metal organic chemical vapor deposition (MOCVD) process. In addition, the first conductivity type semiconductor layer 21 includes n-type impurities (e.g., Si, Ge, and Sn), and the second conductivity type semiconductor layer 25 includes p-type impurities (e.g., Mg, Sr, and Ba). In a case of the light emitting device 10*b* or 10*c* emitting green light or blue light, the first conductivity type semiconductor layer 21 may include GaN or AlGaN containing Si as a dopant, and the second conductivity type semiconductor layer 25 may include GaN or AlGaN containing Mg as a dopant.

Although the first conductivity type semiconductor layer 21 and the second conductivity type semiconductor layer 25 are shown as single layers in the drawings, these layers may be multiple layers. Additionally, or alternatively, the first conductivity type semiconductor layer 21 and the second conductivity type semiconductor layer 25 may also include a superlattice layer. The active layer 23 may include a single quantum well structure or a multiple quantum well structure, and a composition ratio of a compound semiconductor may be adjusted to emit a desired wavelength. For example, the active layer 23 may emit blue light, green light, red light, or ultraviolet light.

The second conductivity type semiconductor layer 25 and the active layer 23 may have a mesa M structure and may be disposed on the first conductivity type semiconductor layer 21. The mesa M may include the second conductivity type semiconductor layer 25 and the active layer 23, and may include a portion of the first conductivity type semiconductor layer 21 as shown in FIG. 3B. The mesa M is located on a partial region of the first conductivity type semiconductor layer 21, and an upper surface of the first conductivity type semiconductor layer 21 may be exposed around the mesa M.

In the illustrated exemplary embodiment, the mesa M is formed so as to expose the first conductivity type semiconductor layer 21. The first conductivity type semiconductor layer 21 is disposed around the mesa M. In another exemplary embodiment, a through hole may be formed through the mesa M to expose the first conductivity type semiconductor layer 21.

In some forms, the first conductivity type semiconductor layer 21 may have a flat light exiting surface. In other forms, the first conductivity type semiconductor layer 21 may have a concave-convex pattern formed by surface texturing on a side of the light exiting surface. Surface texturing may be carried out by patterning, for example, using a dry or wet etching process. For example, cone-shaped protrusions may be formed on the light exiting surface of the first conductivity type semiconductor layer 21, a height of the cone may be about 2 μm to about 3 μm, a distance between the cones may be about 1.5 μm to about 2 μm, and a diameter of a bottom of the cone may be about 3 μm to about 5 μm. The cone may also be truncated, in which an upper diameter of the cone may be about 2 μm to about 3 μm.

In another exemplary embodiment, the concave-convex pattern may include a first concave-convex pattern and a second concave-convex pattern additionally formed on the first concave-convex pattern.

By forming the concave-convex pattern on the surface of the first conductivity type semiconductor layer 21, total internal reflection may be reduced, thereby increasing light extraction efficiency. Surface texturing may be carried out on the first conductivity type semiconductor layers of all of the first, second, and third light emitting devices 10*a*, 10*b*, and 10*c*, and thus, viewing angles of light emitted from the first, second, and third light emitting devices 10*a*, 10*b*, and 10*c* may become uniform. However, the inventive concepts are not limited thereto, and at least one of the light emitting devices 10*a*, 10*b*, and 10*c* may have a flat surface without including the concave-convex pattern.

The ohmic contact layer 27 is disposed on the second conductivity type semiconductor layer 25 to be in ohmic contact with the second conductivity type semiconductor layer 25. The ohmic contact layer 27 may be formed of a single layer or multiple layers, and may be formed of a transparent conductive oxide film or a metal film. For example, the transparent conductive oxide film may include ITO, ZnO, or the like, and the metal film may include a metal such as Al, Ti, Cr, Ni, Au, Ge, Pt, or the like and alloys thereof.

The first contact pad 53 is disposed on the exposed first conductivity type semiconductor layer 21. The first contact pad 53 may be in ohmic contact with the first conductivity type semiconductor layer 21. For example, the first contact pad 53 may be formed of an ohmic metal layer in ohmic contact with the first conductivity type semiconductor layer 21. The ohmic metal layer of the first contact pad 53 may be appropriately selected depending on a semiconductor material of the first conductivity type semiconductor layer 21.

The first contact pad 53 may be omitted. The second contact pad 55 may be disposed on the ohmic contact layer 27. The second contact pad 55 is electrically connected to the ohmic contact layer 27. In another form, the second contact pad 55 may be omitted. The insulation layer 59 covers the mesa M, the ohmic contact layer 27, the first contact pad 53, and the second contact pad 55. The insulation layer 59 has openings 59*a* and 59*b* exposing the first contact pad 53 and the second contact pad 55. The insulation layer 59 may be formed as a single layer or multiple layers. The insulation layer 59 may include an insulating material such as $SiO_2$, $SiN_x$, $Al_2O_3$, and further, the insulation layer 59 may include a distributed Bragg reflector in which insulation layers having different refractive indices from one another are stacked. For example, the distributed Bragg reflector may include at least two insulation layers selected from $SiO_2$, $Si_3N_4$, $SiON$, $TiO_2$, $Ta_2O_5$, $Nb_2O_5$, and $MgF_2$.

The distributed Bragg reflector reflects light emitted from the active layer 23. The distributed Bragg reflector may exhibit high reflectance over a relatively wide wavelength range including a peak wavelength of light emitted from the active layer 23, and may be designed in consideration of an incident angle of light. In an exemplary embodiment, the distributed Bragg reflector may have a higher reflectance for light incident at an incident angle of 0 degree than that for light incident at a different incident angle. In another exemplary embodiment, the distributed Bragg reflector may have a higher reflectance for light incident at a particular incident angle than that for light incident at the incident angle of 0 degree. For example, the distributed Bragg reflector may have a higher reflectance for light incident at an incident angle of 10 degree than that for light incident at the incident angle of 0 degree.

Meanwhile, the light emitting structure of the blue light emitting device 10c has higher internal quantum efficiency compared to those of the light emitting structures of the red light emitting device 10a and the green light emitting device 10b. Accordingly, the blue light emitting device 10c may exhibit higher light extraction efficiency than those of the red and green light emitting devices 10a and 10b. As such, it may be difficult to properly maintain a color mixing ratio of red light, green light, and blue light.

To adjust the color mixing ratio of red light, green light, and blue light, the distributed Bragg reflectors applied to the light emitting devices 10a, 10b, and 10c may be formed to have different reflectance from one another. For example, the blue light emitting device 10c may have the distributed Bragg reflector having a relatively low reflectance compared to those of the red and green light emitting devices 10a and 10b. By way of example only, the distributed Bragg reflector formed in the blue light emitting device 10c may have a reflectance of 95% or less at the incident angle of 0 degree for blue light generated in the active layer 23, and further 90% or less, the distributed Bragg reflector formed in the green light emitting device 10b may have a reflectance of about 95% or more and 99% or less at the incident angle of 0 degree for green light, and the distributed Bragg reflector formed in the red light emitting device 10a may have a reflectance of 99% or more at the incident angle of 0 degree for red light.

In an exemplary embodiment, the distributed Bragg reflectors applied to the red, green, and blue light emitting devices 10a, 10b, and 10c may have a substantially similar thickness. For example, a difference in thickness between the distributed Bragg reflectors applied to these light emitting devices 10a, 10b, and 10c may be 10% or less of a thickness of a thickest distributed Bragg reflector. By reducing the thickness difference between the distributed Bragg reflectors, process conditions applied to the red, green, and blue light emitting devices 10a, 10b, and 10c, for example, a process of patterning the insulation layer 59, may be similarly set, and furthermore, it is possible to prevent the unit pixel manufacturing process from becoming complex. Moreover, the distributed Bragg reflectors applied to the red, green, and blue light emitting devices 10a, 10b, and 10c may have a substantially similar stacking number. However, the inventive concepts are not limited thereto.

In another exemplary embodiment, the different light emitting devices 10a, 10b, and 10c may include different insulation layers 59. For example, the red light emitting device 10a may have the distributed Bragg reflector described above, and the green and blue light emitting devices 10b and 10c may have a single-layered insulation layer 59.

The first electrode pad 61 and the second electrode pad 63 are disposed on the insulation layer 59. The first electrode pad 61 may extend from an upper region of the first contact pad 53 to an upper region of the mesa M, and the second electrode pad 63 may be disposed in the upper region of the mesa M. The first electrode pad 61 may be connected to the first contact pad 53 through the opening 59a, and the second electrode pad 63 may be electrically connected to the second contact pad 55. The first electrode pad 61 may be directly in ohmic contact with the first conductivity type semiconductor layer 21, and in this case, the first contact pad 53 may be omitted. In addition, when the second contact pad 55 is omitted, the second electrode pad 63 may be directly connected to the ohmic contact layer 27.

The first and/or second electrode pads 61 and 63 may be formed of a single layer or a multilayer metal. As a material of the first and/or second electrode pads 61 and 63, metals such as Al, Ti, Cr, Ni, Au, or the like and alloys thereof may be used. For example, the first and second electrode pads 61 and 63 may include a Ti layer or a Cr layer as an upper most layer, and an Au layer thereunder.

Although the light emitting device 10a according to the exemplary embodiment has been briefly described with reference to the drawings, the light emitting device 10a may further include a layer having additional functions in addition to the above-described layers. For example, various layers such as a reflection layer for reflecting light, an additional insulation layer for insulating a specific element, and a solder preventing layer for preventing diffusion of solder may be further included.

In addition, when a flip chip type light emitting device is formed, the mesa may be formed to have various shapes, and locations and shapes of the first and second electrode pads 61 and 63 may also be variously modified. Further, the ohmic contact layer 27 may be omitted, and the second contact pad 55 or the second electrode pad 63 may directly contact the second conductivity type semiconductor layer 25.

Figure 4A:
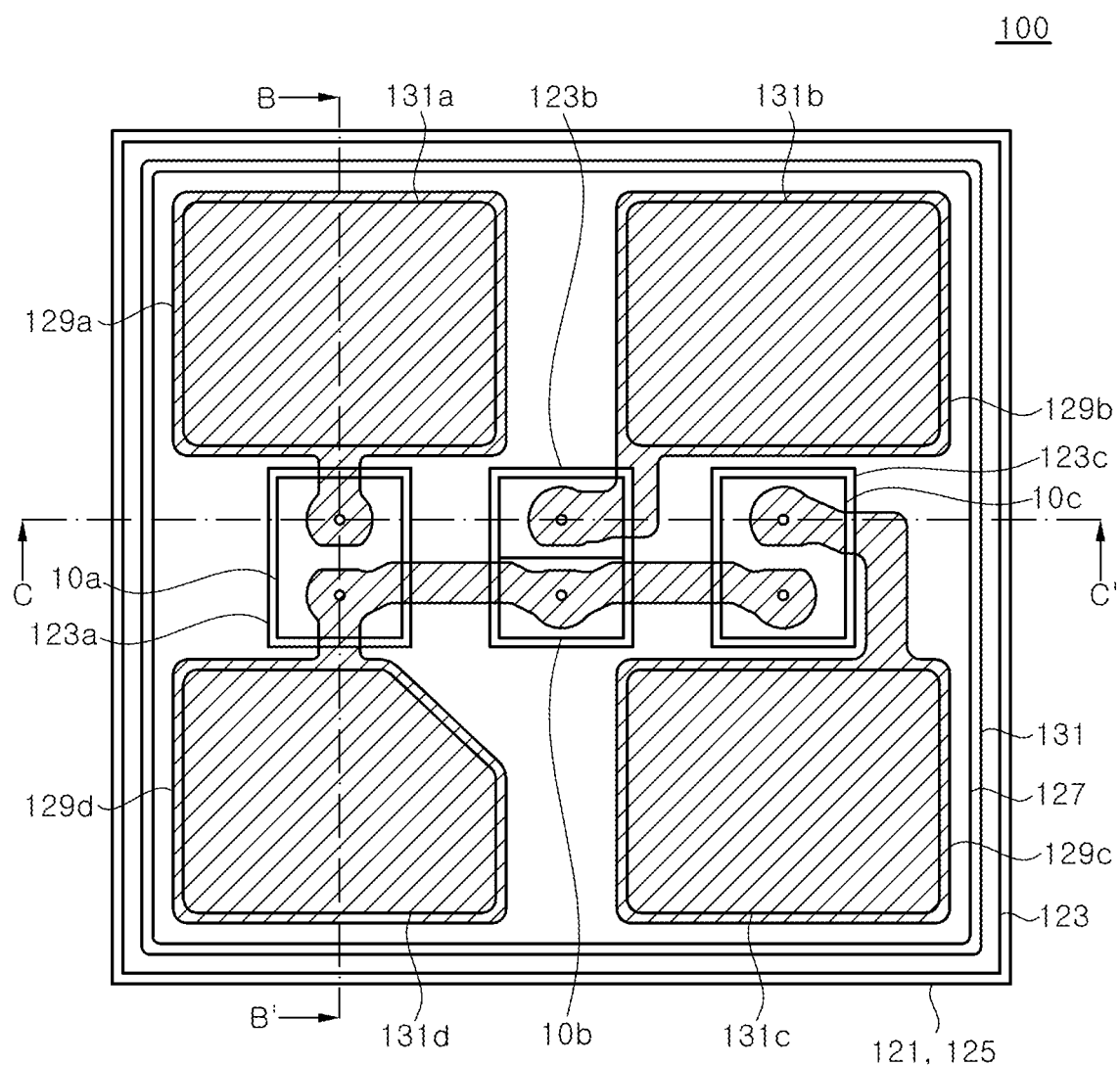
FIG. 4A is a schematic plan view illustrating a unit pixel according to an exemplary embodiment.
Figure 4B:
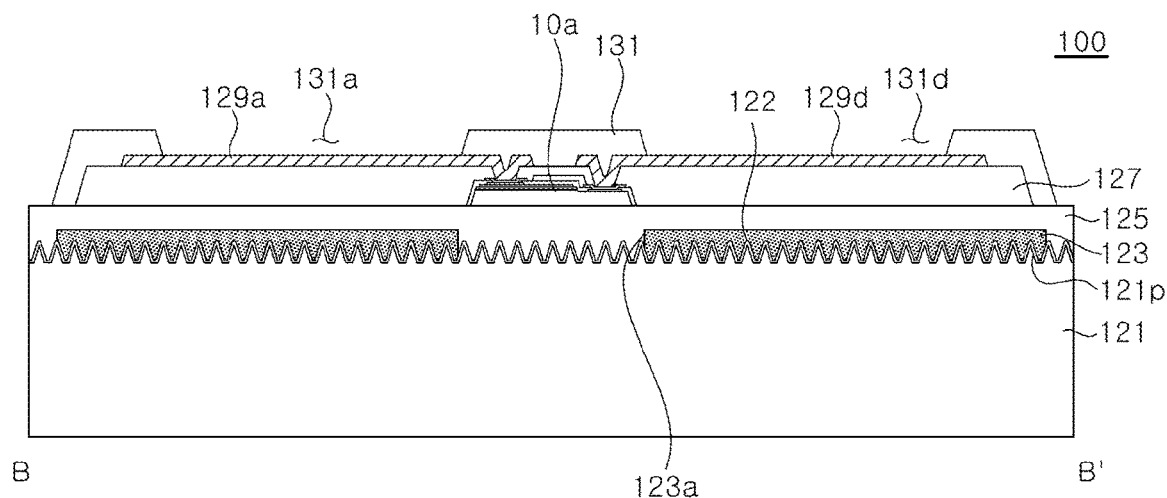
FIG. 4B is a schematic cross-sectional view taken along line B-B' of FIG. 4A.
Figure 4C:
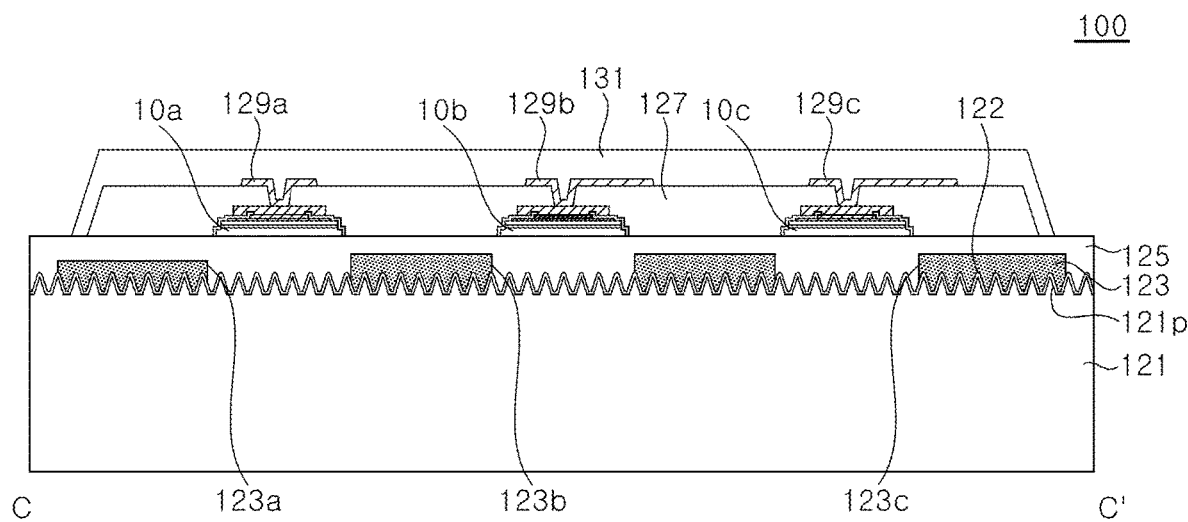
FIG. 4C is a schematic cross-sectional view taken along line C-C' of FIG. 4A.

FIG. 4A is a schematic plan view illustrating a unit pixel 100 according to an exemplary embodiment, FIG. 4B is a schematic cross-sectional view taken along line B-B' of FIG. 4A, and FIG. 4C is a schematic cross-sectional view taken along line C-C' of FIG. 4A.

Referring to FIGS. 4A, 4B, and 4C, the unit pixel 100 may include a transparent substrate 121, first, second, and third light emitting devices 10a, 10b, and 10c, a surface layer 122, a light blocking layer 123, an adhesive layer 125, a step adjustment layer 127, connection layers 129a, 129b, 129c, and 129d, and an insulation material layer 131.

The unit pixel 100 provides a single pixel including the first, second, and third light emitting devices 10a, 10b, and 10c. The first, second, and third light emitting devices 10a, 10b, and 10c emit light of different colors, and the first, second, and third light emitting devices 10a, 10b, and 10c correspond to subpixels, respectively.

The transparent substrate 121 is a light transmissive substrate such as PET, glass substrate, quartz, sapphire substrate, or the like. The transparent substrate 121 is disposed on a light exiting surface of the displaying apparatus (10000 in FIG. 1), and light emitted from the light emitting devices 10a, 10b, and 10c is emitted externally through the transparent substrate 121. The transparent substrate 121 may have an upper surface and a lower surface. The transparent substrate 121 may include a concave-convex pattern 121p on a surface facing the light emitting devices 10a, 10b, and 10c, that is, the upper surface. The concave-convex pattern 121p scatters light emitted from the light emitting devices 10a, 10b, and 10c to increase a viewing angle. In addition, light emitted from the light emitting devices 10a, 10b, and 10c having different viewing angle characteristics from one another may be emitted at a uniform viewing angle by the concave-convex pattern 121p. As such, it is possible to prevent an occurrence of color difference depending on the viewing angle.

The concavo-convex pattern 121p may be regular or irregular. The concavo-convex pattern 121p may have a pitch of about 3 µm, a diameter of about 2.8 µm, and a height of about 1.8 µm, for example. The concavo-convex pattern 121p may be a pattern generally applied to a patterned sapphire substrate, but the inventive concepts are not limited thereto.

The transparent substrate 121 may also include an anti-reflection coating, may include an anti-glare layer, or may be treated with an anti-glare treatment. The transparent substrate 121 may have a thickness of about 50 µm to about 300 µm for example.

The transparent substrate 121 is disposed on the light exiting surface, and the transparent substrate 121 does not include a circuit. However, the inventive concepts are not limited thereto, and, in some exemplary embodiments, the transparent substrate 121 may include the circuit. Although a single unit pixel 100 is illustrated to be formed on a single transparent substrate 121, a plurality of unit pixels 100 may be formed on the single transparent substrate 121.

The surface layer 122 covers the concave-convex pattern 121p of the transparent substrate 121. The surface layer 122 may be formed along a shape of the concave-convex pattern 121p. The surface layer 122 may improve adhesion of the light blocking layer 123 formed thereon. For example, the surface layer 122 may be formed of a silicon oxide layer. The surface layer 122 may be omitted depending on a type of the transparent substrate 121.

The light blocking layer 123 is formed on the upper surface of the transparent substrate 121. The light blocking layer 123 may contact the surface layer 122. The light blocking layer 123 may include an absorbing material which absorbs light such as carbon black. The light absorbing material may prevent light generated in the light emitting devices 10a, 10b, and 10c from leaking from a region between the transparent substrate 121 and the light emitting devices 10a, 10b, and 10c toward a side surface thereof, and may improve contrast of the displaying apparatus.

The light blocking layer 123 may have windows 123a, 123b, and 123c for a light path, so that light generated in the light emitting devices 10a, 10b, and 10c is incident on the transparent substrate 121, and for this purpose, the light blocking layer 123 may be patterned so as to expose the transparent substrate 121. Widths of the windows 123a, 123b, and 123c may be narrower than those of the light emitting devices, but the inventive concepts are not limited thereto. For example, the widths of the windows 123a, 123b, and 123c may be greater than those of the light emitting devices 10a, 10b, and 10c, and thus, a gap may be formed between the light emitting device 10a and the light blocking layer 123.

The adhesive layer 125 is attached onto the transparent substrate 121. The adhesive layer 125 may cover the light blocking layer 123. The adhesive layer 125 may be attached onto an entire surface of the transparent substrate 121, but the inventive concepts are not limited thereto, and, in some exemplary embodiments, the adhesive layer 125 may be attached to a portion of the transparent substrate 121 so as to expose a region near an edge of the transparent substrate 121. The adhesive layer 125 is used to attach the light emitting devices 10a, 10b, and 10c to the transparent substrate 121. The adhesive layer 125 may fill the window 123a, 123b, and 123c formed in the light blocking layer 123, as shown in FIG. 4B.

The adhesive layer 125 may be formed as a light transmissive layer, and transmits light emitted from the light emitting devices 10a, 10b, and 10c. The adhesive layer 125 may be formed using an organic adhesive. For example, the adhesive layer 125 may be formed using a transparent epoxy. In addition, the adhesive layer 125 may include a diffuser such as $SiO_2$, $TiO_2$, ZnO, or the like to diffuse light. A light diffuser prevents the light emitting devices 10a, 10b and 10c from being observed from the light exiting surface.

Meanwhile, the first, second, and third light emitting devices 10a, 10b, and 10c are disposed on the transparent substrate 121. The first, second, and third light emitting devices 10a, 10b, and 10c may be attached to the transparent substrate 121 by the adhesive layer 125. The first, second, and third light emitting devices 10a, 10b, and 10c may be disposed corresponding to the windows 123a, 123b, and 123c of the light blocking layer 123.

The first, second, and third light emitting devices 10a, 10b, and 10c may be disposed on a flat surface of the adhesive layer 125 as shown in FIGS. 4B and 4C. The adhesive layer 125 may be disposed under lower surfaces of the light emitting devices 10a, 10b, and 10c. In another exemplary embodiment, the adhesive layer 125 may partially cover side surfaces of the first, second, and third light emitting devices 10a, 10b, and 10c.

The first, second, and third light emitting devices 10a, 10b, and 10c may be, for example, a red light emitting device, a green light emitting device, and a blue light emitting device. Since a detailed configuration of each of the first, second, and third light emitting devices 10a, 10b, and 10c is the same as described above with reference to FIGS. 3A and 3B, a detailed description thereof will be omitted.

The first, second, and third light emitting devices 10a, 10b, and 10c may be arranged in a line, as illustrated in FIG. 4A. For instance, the first, second, and third light emitting devices 10a, 10b, and 10c are arranged side by side and surrounded by connection layers. In particular, in a case that the transparent substrate 121 is a sapphire substrate, the sapphire substrate may include clean-cut surfaces (e.g., m-plane) and non-clean-cut surfaces (e.g., a-plane) due to a location of a crystal plane along a cutting direction. For example, when the sapphire substrate is cut into a quadrangular shape, two cutting planes on both sides thereof (e.g., m-plane) may be cut cleanly along the crystal plane, and two remaining cutting planes (e.g., a-plane) disposed in a direction perpendicular to the cutting planes may not be cut cleanly. In this case, the clean-cut surfaces of the sapphire substrate 121 may be flush with an arrangement direction of the light emitting devices 10a, 10b, and 10c. For example, in FIG. 4A, the clean-cut surfaces (e.g., m-plane) may be disposed up and down, and the two remaining cut surfaces (e.g., a-plane) may be disposed left and right.

In addition, each of the first, second, and third light emitting devices 10a, 10b, and 10c may be arranged in parallel to one another in a major axis direction. Minor axis directions of the first, second, and third light emitting devices 10a, 10b, and 10c may coincide with an arrangement direction of the light emitting devices.

The first, second, and third light emitting devices 10a, 10b, and 10c may have been those described above with reference to FIGS. 3A and 3B, but the inventive concepts are not limited thereto, and various light emitting devices of a lateral type or a flip-chip structure may be used.

The step adjustment layer 127 covers the first, second, and third light emitting devices 10a, 10b, and 10c and the adhesive layer 125. The step adjustment layer 127 has openings 127a exposing the first and second electrode pads 61 and 63 of the light emitting devices 10a, 10b, and 10c. The step adjustment layer 127 assists to securely form the connection layers by uniformly adjusting elevations of surfaces on which the connection layers 129a, 129b, 129c, and 129d are formed. The step adjustment layer 127 may be formed of, for example, photosensitive polyimide.

The step adjustment layer 127 may be disposed in a region surrounded by an edge of the adhesive layer 125, but the inventive concepts are not limited thereto. For example, the step adjustment layer 127 may be formed to partially expose the edge of the adhesive layer 125, as shown in FIG. 4B.

A side surface of the step adjustment layer 127 may be inclined at an angle less than 90 degrees with respect to an upper surface of the adhesive layer 125. For example, the side surface of the step adjustment layer 127 may have an inclination angle of about 60 degrees with respect to the upper surface of the adhesive layer 125.

The first, second, third, and fourth connection layers 129a, 129b, 129c, and 129d are formed on the step adjustment layer 127. The connection layers 129a, 129b, 129c, and 129d may be connected to the first and second electrode pads 61 and 63 of the first, second, and third light emitting devices 10a, 10b, and 10c through the openings 127a of the step adjustment layer 127, as shown in FIGS. 3A and 3B.

In an exemplary embodiment, as illustrated in FIGS. 4A and 4B, the first connection layer 129a may be electrically connected to a second conductivity type semiconductor layer of the first light emitting device 10a, the second connection layer 129b may be electrically connected to a second conductivity of the second light emitting device 10b, the third connection layer 129c may be electrically connected to a second conductivity type semiconductor layer of the third light emitting device 10c, and the fourth connection layer 129d may be commonly electrically connected to first conductivity type semiconductor layers of the first, second, and third light emitting devices 10a, 10b, and 10c. The first, second, third, and fourth connection layers 129a, 129b, 129c, and 129d may be formed together on the step adjustment layer 127, and may include, for example, Au.

In another exemplary embodiment, the first connection layer 129a may be electrically connected to the first conductivity type semiconductor layer of the first light emitting device 10a, the second connection layer 129b may be electrically connected to the first conductivity type semiconductor layer of the second light emitting device 10b, the third connection layer 129c may be electrically connected to the first conductivity type semiconductor layer of the third light emitting device 10c, and the fourth connection layer 129d may be commonly electrically connected to the second conductivity type semiconductor layers of the first, second, and third light emitting devices 10a, 10b, and 10c. The first, second, third, and fourth connection layers 129a, 129b, 129c, and 129d may be formed together on the step adjustment layer 127.

The insulation material layer 131 may be formed to have a thickness smaller than that of the step adjustment layer 127. A sum of the thicknesses of the insulation material layer 131 and the step adjustment layer 127 may be about 1 μm or more and about 50 μm or less, but the inventive concepts are not limited thereto. Meanwhile, a side surface of the insulation material layer 131 may have an inclination angle less than 90 degree with respect to the upper surface of the adhesive layer 125, for example, an inclination angle of about 60 degree.

The insulation material layer 131 covers side surfaces of the step adjustment layer 127 and the connection layers 129a, 129b, 129c, and 129d. In addition, the insulation material layer 131 may cover a portion of the adhesive layer 125. The insulation material layer 131 may have openings 131a, 131b, 131c, and 131d exposing the connection layers 129a, 129b, 129c, and 129d, and thus, pad regions of the unit pixel 100 may be defined.

In an exemplary embodiment, the insulation material layer 131 may be a translucent material, and may be formed of an organic or inorganic material. The insulation material layer 131 may be formed of, for example, polyimide. When the insulation material layer 131 along with the step adjustment layer 127 is formed of polyimide, all of lower, side, and upper surfaces of the connection layers 129a, 129b, 129c, and 129d may be surrounded by the polyimide, except for the pad regions.

Meanwhile, the unit pixel 100 may be mounted on a circuit board using a bonding material such as solder, and the bonding material may bond the connection layers 129a, 129b, 129c, and 129d exposed to the openings 131a, 131b, 131c, and 131d of the insulation material layer 131 to pads on the circuit board.

According to the illustrated exemplary embodiment, the unit pixel 100 does not include separate bumps, and the connection layers 129a, 129b, 129c, and 129d are used as bonding pads. However, the inventive concepts are not limited thereto, and bonding pads covering the openings 131a, 131b, 131c, and 131d of the insulation material layer 131 may be formed. In an exemplary embodiment, the bonding pads may be formed to partially cover the light emitting devices 10a, 10b, and 10c outside of upper regions of the first, second, third, and fourth connection layers 129a, 129b, 129c, and 129d.

In the illustrated exemplary embodiment, the light emitting devices 10a, 10b, and 10c are described as being attached to the transparent substrate 121 by the adhesive layer 125, but the light emitting devices 10a, 10b, and 10c may be coupled to the transparent substrate 121 using another coupler instead of the adhesive layer 125. For example, the light emitting devices 10a, 10b, and 10c may be coupled to the transparent substrate 121 using spacers, and thus, gas or liquid may be filled in a region between the light emitting devices 10a, 10b, and 10c and the transparent substrate 121. An optical layer that transmits light emitted from the light emitting devices 10a, 10b, and 10c may be formed by the gas or liquid. The adhesive layer 125 described above is also an example of the optical layer. Herein, the optical layer is formed of a material such as gas, liquid, or solid, different from those of the light emitting devices 10a, 10b, and 10c, and thus, is distinguished from the materials of the semiconductor layers in the light emitting devices 10a, 10b, and 10c.

Figure 5A:
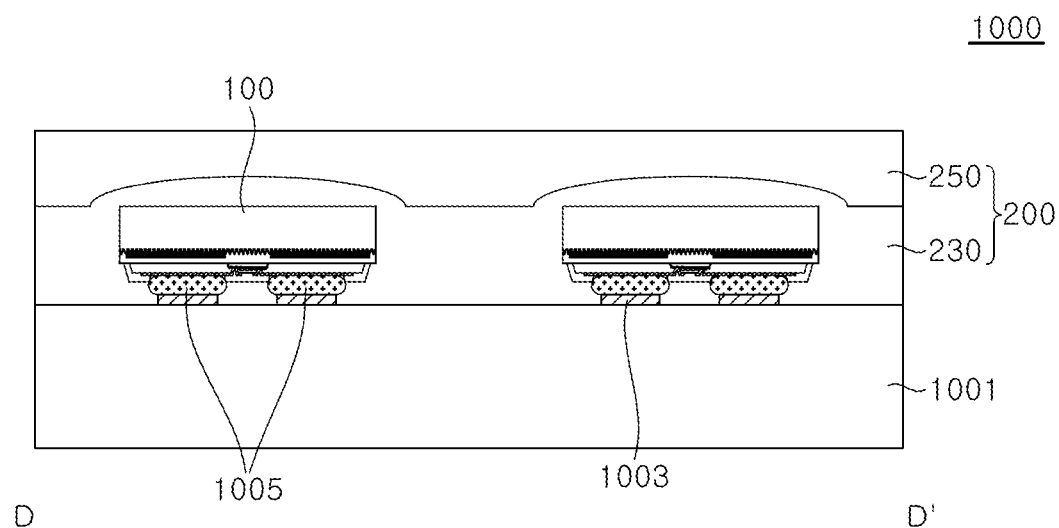
FIG. 5A is a schematic partial cross-sectional view taken along line D-D' of FIG. 2 to illustrate the pixel module according to an exemplary embodiment.
Figure 5B:
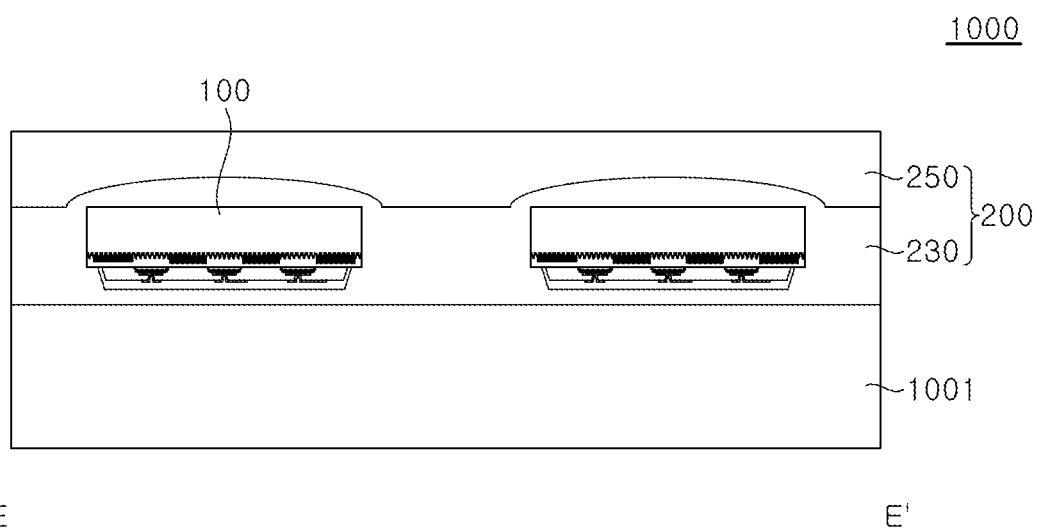
FIG. 5B is a schematic partial cross-sectional view taken along line E-E' of FIG. 2 to illustrate the pixel module according to an exemplary embodiment.

FIG. 5A is a schematic partial cross-sectional view taken along line D-D' of FIG. 2 to illustrate the pixel module 1000 according to an exemplary embodiment, and FIG. 5B is a schematic partial cross-sectional view taken along line E-E' of FIG. 2.

Referring to FIGS. 5A and 5B, the pixel module 1000 includes the circuit board 1001 and the unit pixels 100 arranged on the circuit board 1001. Furthermore, the pixel module 1000 may further include the molding member 200 covering the unit pixels 100.

The circuit board 1001 may include a circuit for electrically connecting the panel substrate 2100 and the light emitting devices 10a, 10b, and 10c. The circuits in the circuit board 1001 may be formed in a multi-layer structure. The circuit board 1001 may also include a passive circuit for driving the light emitting devices 10a, 10b, and 10c in a passive matrix driving manner or an active circuit for driving the light emitting devices 10a, 10b, and 10c in an active matrix driving manner. The circuit board 1001 may include pads 1003 exposed on a surface thereof.

Since a detailed configuration of the unit pixels 100 is the same as described above with reference to FIGS. 4A, 4B, and 4C, a detailed description thereof will be omitted to avoid redundancy. The unit pixels 100 may be arranged on the circuit board 1001. The unit pixels 100 may be arranged in various matrices, such as 2×2, 2×3, 3×3, 4×4, 5×5, and the like.

The unit pixels 100 may be bonded to the circuit board 1001 through a bonding material 1005. For example, the bonding material 1005 bonds connection layers 129a, 129b, 129c, and 129d exposed through the openings 131a, 131b, 131c, and 131d of the insulation material layer 131 described with reference to FIGS. 4A, 4B, and 4C to pads 1003. The bonding material 1005 may be, for example, a solder such as AuSn, In, InSn, Au, Sn, ACF, ACP, or the like, and when using the bonding material 1005 as the solder, the unit pixel 100 and the circuit board 1001 may be bonded through a reflow process after a solder paste is disposed on the pads 1003 on the circuit board 1001 using appropriate technology such as screen printing. The pads 1003 on the circuit board 1001 may protrude above an upper surface of the circuit board 1001, or may be disposed under the upper surface of the circuit board 1001.

According to the illustrated exemplary embodiment, the bonding material 1005 having a single structure may be disposed between the connection layers 129a, 129b, 129c, and 129d and the pads 1003, and the bonding material 1005 may directly connect the connection layers 129a, 129b, 129c, and 129d and the pads 1003.

The molding member 200 covers the plurality of unit pixels 100. A total thickness of the molding member 200 may be in a range of about 50 μm to 400 μm. The molding member 200 may include a light diffusion layer 230 and a black molding layer 250. The light diffusion layer 230 may include a transparent matrix such as an epoxy molding compound and light diffusion particles dispersed in the transparent matrix. The light diffusion particles may be, for example, silica or TiO$_2$, without being limited thereto. The light diffusion layer 230 may have, for example, a thickness within a range of about 25 μm to about 200 μm, and the light diffusion particles may be included in the light diffusion layer 230, for example, within a range of about 0.2 wt % to 10 wt % based on a total weight of the light diffusion layer 230. The light diffusion layer 230 scatters light emitted from the light emitting devices 10a, 10b, and 10c. The light diffusion layer 230 assists to uniformly mix light of different colors emitted from the unit pixel 100, and also prevents light emitted to a side surface of the unit pixel 100 from being emitted to the outside.

The black molding layer 250 includes a material that absorbs light in a matrix. The matrix may be, for example, a dry-film type solder resist (DFSR), photoimageable solder resist (PSR), an epoxy molding compound (EMC), or the like, without being limited thereto. The light absorbing material may include a light absorbing dye such as carbon black. The light absorbing dye may be directly dispersed in the matrix, or may be coated on surfaces of organic or inorganic particles to be dispersed in the matrix. Various types of organic or inorganic particles may be used so as to coat the light absorbing material. For example, particles coated with TiO$_2$ or silica particles with carbon black may be used. The black molding layer 250 may be formed to have a thickness within a range of about 25 μm to about 200 μm. A light transmittance may be adjusted by adjusting a concentration of the light absorbing material contained in the molding member 200. The light absorbing material may within a range of about 0.05 wt % to about 10 wt % relative to a total matrix weight.

In other forms, the black molding layer 250 may be formed as a single layer in which the light absorbing material is uniformly dispersed, but the inventive concepts are not limited thereto. The black molding layer 250 may be formed of a plurality of layers having different concentrations of the light absorbing material. For example, the black molding layer 250 may include two layers having different concentrations of the light absorbing material. In this case, a first layer disposed closer to the light diffusion layer 230 may contain more light absorbing material than a second layer. A total absorption of light emitted upward from the unit pixel 100 may be reduced by making a light absorptivity of the first layer higher than that of the second layer, and thus, luminance of the pixel module 1000 may be increased.

In an exemplary embodiment, when the black molding layer 250 is formed of the plurality of layers, the layers may be clearly distinguished from one another. For example, after the layers having different concentrations of the light absorbing material are individually manufactured as films, the black molding layer 250 may be manufactured by sandwiching the films. Alternatively, the black molding layer 250 may be formed by continuously printing the layers having different concentrations of the light absorbing material. In another exemplary embodiment, the black molding layer 250 may be formed such that the concentration of the light absorbing material gradually decreases in a thickness direction thereof.

Light incident vertically from the unit pixels 100 has a short path passing through the black molding layer 250 and thus, easily passes through the black molding layer 250, but light incident with an inclination angle has a long path through the black molding layer 250, and thus, most of light is absorbed in the black molding layer 250. As such, light interference between the unit pixels 100 may be prevented by the black molding layer 250, and thus, a contrast of the displaying apparatus may be improved and moreover, a color deviation may be reduced.

The black molding layer 250 may be formed to have a thickness equal to or smaller than that of the light diffusion layer 230. For example, in a region between the unit pixels 100, the black molding layer 250 may have a thickness equal to or smaller than that of the light diffusion layer 230. Meanwhile, the light diffusion layer 230 and the black molding layer 250 in an upper region of the unit pixel 100 may be thinner than the light diffusion layer 230 and the black molding layer 250 in the region between the unit pixels 100, respectively. Furthermore, as shown in FIGS. 5A and 5B, the thickness of the black molding layer 250 in the upper region of the unit pixels 100 may be greater than that of the light diffusion layer 230, without being limited thereto. For example, in the upper region of the unit pixels 100, the thickness of the black molding layer 250 may be smaller than that of the light diffusion layer 230.

In addition, in the upper region of the unit pixels 100, the light diffusion layer 230 may have a convex upper surface, and the black molding layer 250 may have a flat upper surface compared to that of the light diffusion layer 230. As the thickness of the light diffusion layer 230 increases, the thickness of the convex portion of the light diffusion layer 230 increases in the upper region of the unit pixels 100. The thickness of the light diffusion layer 230 may vary along a lateral direction of the circuit board 1001. In particular, the light diffusion layer 230 may have a relatively smaller thickness in the upper region of the unit pixels 100 than in the region between the unit pixels 100. The thickness of the black molding layer 250 may also vary along the lateral direction of the circuit board 1001. In particular, the black molding layer 250 may have a relatively smaller thickness in the upper region of the unit pixels 100 than in the region between the unit pixels 100.

A ratio of a minimum thickness of the black molding layer 250 to a maximum thickness of the light diffusion layer 230 in the upper region of the unit pixels 100 may be greater than a ratio of a maximum thickness of the black molding layer 250 to a minimum thickness of the light diffusion layer 230 in the region between the unit pixels 100. For example, although the light diffusion layer 230 and the black molding layer 250 have the same thickness in the region between the unit pixels 100, the black molding layer 250 may be thicker than the light diffusion layer 230 in the upper region of the unit pixels 100.

In another exemplary embodiment, the ratio of the minimum thickness of the black molding layer 250 to the maximum thickness of the light diffusion layer 230 in the upper region of the unit pixels 100 may be smaller than the ratio of the maximum thickness of the black molding layer 250 to the minimum thickness of the light diffusion layer 230 in the region between the unit pixels 100. For example, although the light diffusion layer 230 and the black molding layer 250 have the same thickness in the region between the unit pixels 100, the black molding layer 250 may be thinner than the light diffusion layer 230 in the upper region of the unit pixels 100. By forming the black molding layer 250 relatively thick in the region between the unit pixels 100 and forming the black molding layer 250 relatively thin in the upper region of the unit pixels 100, it is possible to increase an efficiency of light emitted upward from the unit pixels 100 and to further improve a contrast by blocking light incident with an inclination angle.

The molding member may be formed using, for example, appropriate techniques such as lamination, spin coating, slit coating, printing, or the like. As an example, the molding member 200 may be formed on the unit pixels 100 by a vacuum lamination technique after constricting the light diffusion layer 230 and the black molding layer 250. The vacuum lamination technique will be described again later.

For example, after the light diffusion layer 230 is applied, the black molding layer 250 in a form of a film may be formed on the unit pixels 100 by a vacuum lamination technique.

A displaying apparatus 10000 may be provided by mounting the plurality of pixel modules 1000 shown in FIGS. 5A and 5B on the panel substrate 2100 of FIG. 1. The circuit board 1001 has bottom pads connected to the pads 1003. The bottom pads may be disposed to correspond one-to-one to the pads 1003, but the number of the bottom pads may be reduced through a common connection.

In the illustrated exemplary embodiment, since the unit pixels 100 are formed into the pixel module 1000, and the pixel modules 1000 are mounted on the panel substrate 2100, the displaying apparatus 10000 may be provided, and thus, a process yield of the displaying apparatus may be improved. However, the inventive concepts are not limited thereto, and the unit pixels 100 may be directly mounted on the panel substrate 2100.

Figure 6A:
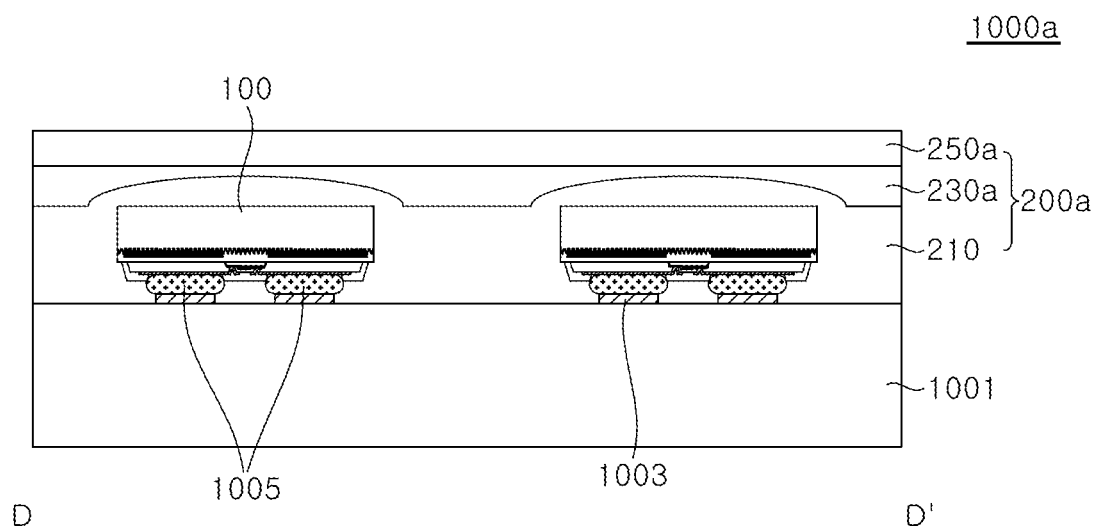
FIG. 6A is a schematic partial cross-sectional view taken along line D-D' of FIG. 2 to illustrate a pixel module according to an exemplary embodiment.
Figure 6B:
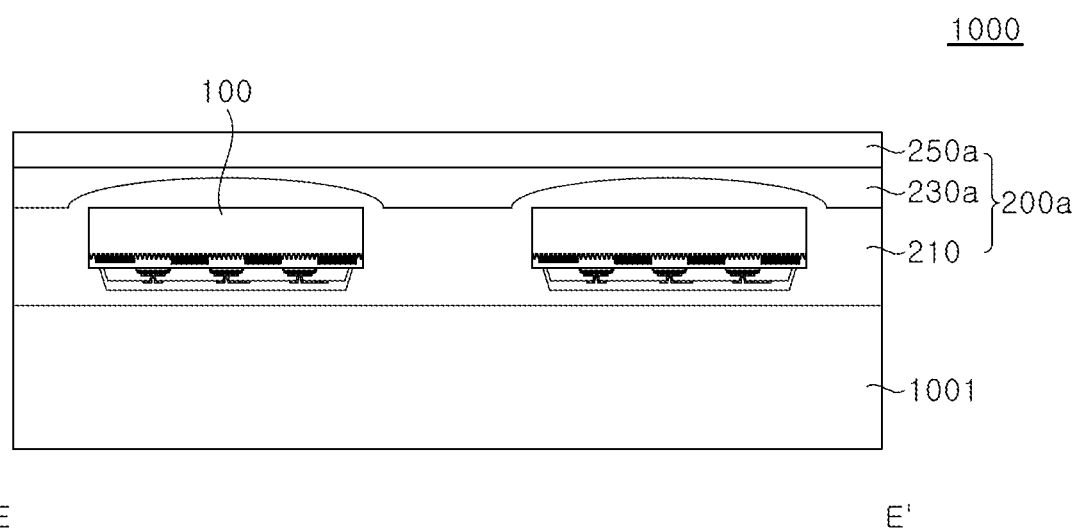
FIG. 6B is a schematic partial cross-sectional view taken along line E-E' of FIG. 2 to illustrate a pixel module according to an exemplary embodiment.

FIG. 6A and FIG. 6B are schematic partial cross-sectional views taken along line D-D' and E-E' of FIG. 2 to illustrate a pixel module 1000a according to an exemplary embodiment.

Referring to FIGS. 6A and 6B, the pixel module 1000a according to the present exemplary embodiment is substantially similar to the pixel module 1000 described with reference to FIGS. 5A and 5B, except that a molding member 200a includes a transparent molding layer 210, a light diffusion layer 230a, and a black molding layer 250a.

The transparent molding layer 210 is formed of a transparent material such as an epoxy molding compound. The light diffusion layer 230a is disposed on the transparent molding layer 210, and the black molding layer 250a is disposed on the light diffusion layer 230a. Since the light diffusion layer 230a and the black molding layer 250a are similar to the light diffusion layer 230 and the black molding layer 250 described above, a detailed description of the same elements will be omitted to avoid redundancy. A total thickness of the molding member 200a may range from about 50 μm to about 400 μm, the transparent molding layer 210 in the range from about 20 μm to about 150 μm, the light diffusion layer 230a from about 15 μm to about 150 μm, and the black molding layer 250a from about 15 μm to about 150 μm.

As shown in FIGS. 6A and 6B, the transparent molding layer 210 may have a thickness larger than a thickness of the light diffusion layer 230a or the black molding layer 250a. Furthermore, the transparent molding layer 210 may have a thickness equal to or larger than total thicknesses of the light diffusion layer 230a and the black molding layer 250a. For example, in the region between the unit pixels 100, the transparent molding layer 210 may have the thickness greater than or equal to the total thicknesses of the light diffusion layer 230a and the black molding layer 250a. In the region between the unit pixels 100, the black molding layer 250a may have the thickness equal to or smaller than the light diffusion layer 230a.

Meanwhile, the transparent molding layer 210 and the light diffusion layer 230a in the upper region of the unit pixel 100 may be thinner than the transparent molding layer 210 and the light diffusion layer 230a in the region between the unit pixels 100, respectively. In contrast, the black molding layer 250a may have a substantially uniform thickness without a change in thickness, as shown in FIGS. 6A and 6B.

The thickness of the black molding layer 250a in the upper region of the unit pixels 100 may be greater than the thickness of the transparent molding layer 210 and/or the thickness of the light diffusion layer 230a, without being limited thereto. For example, in the upper region of the unit pixels 100, the thickness of the black molding layer 250a may be smaller than the thickness of the transparent molding layer 210 or the thickness of the light diffusion layer 230a. Meanwhile, in the upper region of the unit pixels 100, the thickness of the transparent molding layer 210 may be greater than the thickness of the light diffusion layer 230a.

In the upper region of the unit pixels 100, the transparent molding layer 210 may have a convex upper surface, and the light diffusion layer 230a and the black molding layer 250a may have a flat upper surface compared to the transparent molding layer 210. Although the upper surface of the light diffusion layer 230a is illustrated as being flat, the upper surface of the light diffusion layer 230a may also have a convex shape, and the upper surface of the black molding layer 250a may be relatively flatter than the upper surface of the light diffusion layer 230a.

As the thickness of the transparent molding layer 210 increases, the thickness of the convex portion of the transparent molding layer 210 in the upper region of the unit pixels 100 increases. The thicknesses of the transparent molding layer 210 and the light diffusion layer 230a may vary along the lateral direction of the circuit board 1001. In particular, the transparent molding layer 210 and the light diffusion layer 230a may have a relatively smaller thickness in the upper region of the unit pixels 100 than in the region between the unit pixels 100. The thickness of the black molding layer 250a may not substantially change along the lateral direction of the circuit board 1001. However, the present disclosure is not limited thereto, and the black molding layer 250a may also have a relatively smaller thickness in the upper region of the unit pixels 100 than in the region between the unit pixels 100.

A ratio of a minimum thickness of the black molding layer 250a to a minimum thickness of the light diffusion layer 230a in the upper region of the unit pixels 100 may be greater than a ratio of a maximum thickness of the light diffusion layer 230a to a maximum thickness of the black molding layer 250 in the region between the unit pixels 100. For example, although the light diffusion layer 230a and the black molding layer 250a have the same thickness in the region between the unit pixels 100, the black molding layer 250a may be thicker than the light diffusion layer 230a in the upper region of the unit pixels 100.

Figure 7A:
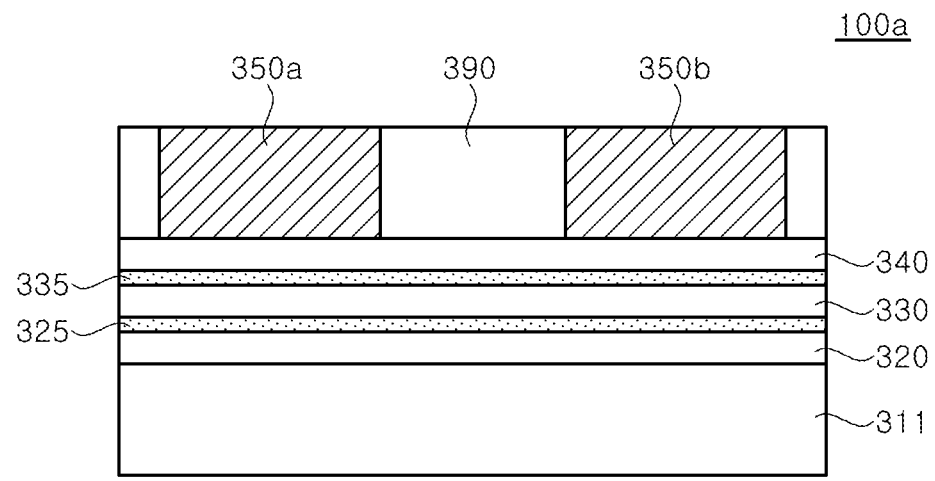
FIG. 7A is a schematic cross-sectional view illustrating a unit pixel according to another exemplary embodiment.
Figure 7B:
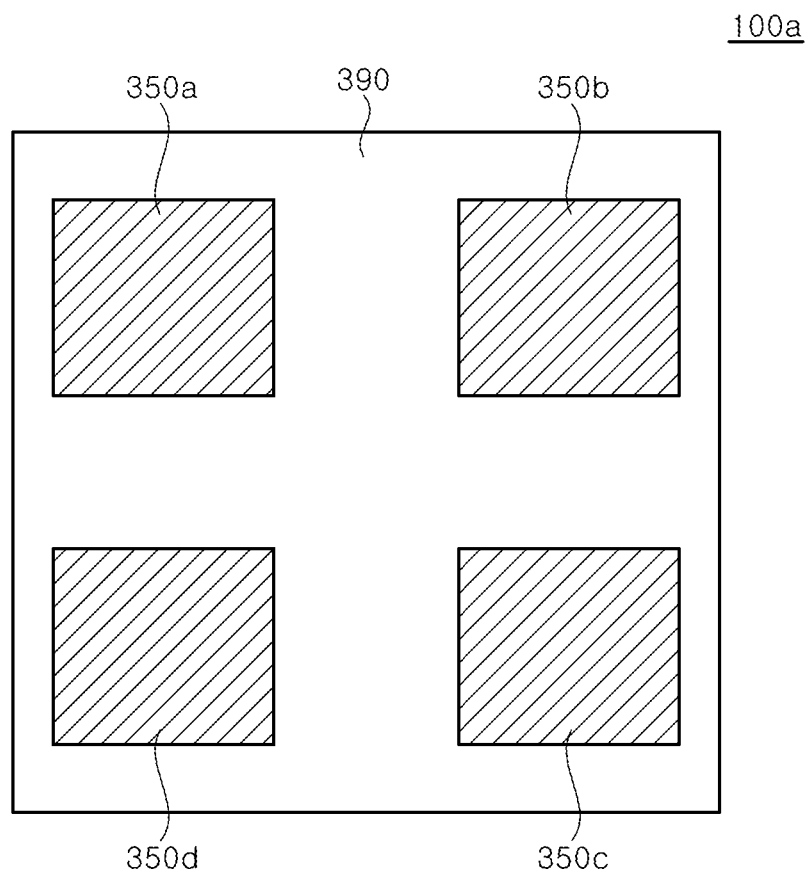
FIG. 7B is a schematic plan view illustrating the unit pixel according to another exemplary embodiment.

FIG. 7A is a schematic cross-sectional view illustrating a unit pixel 100a according to another exemplary embodiment, and FIG. 7B is a schematic plan view illustrating the unit pixel 100a according to another exemplary embodiment.

Referring to FIGS. 7A and 7B, the unit pixel 100a has a structure in which first, second, and third light emitting stacks 320, 330, and 340 are stacked, which is different from the unit pixel 100 described with reference to FIGS. 4A, 4B, and 4C.

The unit pixel 100a includes a light emitting stacked structure, a first connection electrode 350a, a second connection electrode 350b, a third connection electrode 350c, and a fourth connection electrode 350d formed on the light emitting stacked structure, and a passivation layer 390 surrounding the connection electrodes 350a, 350b, 350c, and 350d. The unit pixel 100a may also include a substrate 311. Meanwhile, the light emitting stacked structure may include the first light emitting stack 320, the second light emitting stack 330, and the third light emitting stack 340. Although the light emitting stacked structure has been illustrated as being configured to include the three light emitting stacks 320, 330, and 340, the inventive concepts are not limited to a specific number of light emitting stacks. For example, in some exemplary embodiments, the light emitting stacked structure may include two or more light emitting stacks. Herein, as shown in FIG. 7A, the unit pixel 100a includes the three light emitting stacks 320, 330, and 340 according to an exemplary embodiment.

The substrate 311 may be a light transmissive insulating substrate. However, in some exemplary embodiments, the substrate 311 may be formed to be translucent or partially transparent so as to transmit only light of a specific wavelength or transmit only a portion of light of a specific wavelength. The substrate 311 may be a growth substrate on which the first light emitting stack 320 may be epitaxially grown, for example, a sapphire substrate. However, the substrate 311 is not limited to the sapphire substrate, and may include various other transparent insulating materials. For example, the substrate 311 may include a glass, a quartz, a silicon, an organic polymer, or an organic-inorganic composite material, and may be, for example, such as silicon carbide (SiC), gallium nitride (GaN), indium gallium nitride (InGaN), aluminum gallium nitride (AlGaN), aluminum nitride (AlN), gallium oxide ($Ga_2O_3$), or a silicon substrate. In addition, the substrate 311 may include irregularities on an upper surface thereof, and may be, for example, a patterned sapphire substrate. By including the irregularities on the upper surface, extraction efficiency of light generated in the first light emitting stack 320 in contact with the substrate 311 may be increased. The irregularities of the substrate 311 may be employed so as to selectively increase a luminous intensity of the first LED stack 320 compared to the second LED stack 330 and the third LED stack 340.

The first, second, and third light emitting stacks 320, 330, and 340 are configured to emit light towards the substrate 311. Accordingly, light emitted from the third light emitting stack 340 may pass through the first and second light emitting stacks 320 and 330. According to an exemplary embodiment, the first, second, and third light emitting stacks 320, 330, and 340 may emit light of different peak wavelengths from one another. In general, as the light emitting stack disposed farther from the substrate 311 emits light of a longer wavelength than that of the light emitting stack disposed near the substrate 311, a light loss may be reduced. In some forms, so as to adjust a color mixing ratio of the first, second, and third light emitting stacks 320, 330, and 340, the second LED stack 330 may emit light of a shorter wavelength than that of the first LED stack 320. Accordingly, the luminous intensity of the second LED stack 330 may be reduced and the luminous intensity of the first LED stack 320 may be increased. It is possible to dramatically change a luminous intensity ratio of light emitted from the first, second, and third light emitting stacks. For example, the first light emitting stack 320 may be configured to emit green light, the second light emitting stack 330 to emit blue light, and the third light emitting stack 340 to emit red light. Accordingly, it is possible to relatively decrease the luminous intensity of blue light and relatively increase the luminous intensity of green light, and as a result, the luminous intensity ratio of red, green, and blue to be close to 3:6:1 may be easily adjusted. Furthermore, an emission area of the first, second, and third LED stacks 320, 330, and 340 may be less than or equal to about 10000 $um^2$, further, may be less than or equal to 4000 $um^2$, furthermore, less than or equal to 2500 $um^2$. In addition, the emission area may be increased as a distance to the substrate 311 decreases, and the luminous intensity of green light may be further increased by disposing the first LED stack 320 emitting green light closest to the substrate 311.

The first to third light emitting stacks 320, 330, and 340 include, as those described with reference to FIGS. 3A and 3B, a first conductivity type semiconductor layer 21, an active layer 23, and a second conductivity type semiconductor layer 25, respectively. According to an exemplary embodiment, the first light emitting stack 320 may include a semiconductor material emitting green light, such as GaN, InGaN, GaP, AlGaInP, AlGaP, or the like. The second light emitting stack 330 may include a semiconductor material emitting blue light, such as GaN, InGaN, ZnSe, or the like, without being limited thereto. According to an exemplary embodiment, the third light emitting stack 340 may include, for example, a semiconductor material emitting red light such as AlGaAs, GaAsP, AlGaInP, GaP, or the like, without being limited thereto.

According to an exemplary embodiment, each of the first conductivity type semiconductor layers 21 and the second conductivity type semiconductor layers 25 of the first, second, and third light emitting stacks 320, 330, and 340 may have a single-layered structure or a multi-layered structure and, in some exemplary embodiments, may include a superlattice layer. Furthermore, the active layers 23 of the first, second, and third light emitting stacks 320, 330, and 340 may have a single quantum well structure or a multiple quantum well structure.

A first adhesive layer 325 is disposed between the first light emitting stack 320 and the second light emitting stack 330, and a second adhesive layer 335 is disposed between the second light emitting stack 330 and the third light emitting stack 340. The first and second adhesive layers 325 and 335 may include a non-conductive material that transmits light. For example, the first and second adhesive layers 325 and 335 may include an optically clear adhesive (OCA), which may include epoxy, polyimide, SUB, spin-on-glass (SOG), benzocyclobutene (BCB), without being limited thereto.

According to an exemplary embodiment, each of the first, second, and third light emitting stacks 320, 330 and 340 may be driven independently. More specifically, a common voltage may be applied to one of the first and second conductivity type semiconductor layers of each of the light emitting stacks, and an individual light emitting signal may be applied to another one of the first and second conductivity type semiconductor layers of each of the light emitting stacks. Referring back to FIGS. 3A and 3B, the first conductivity type semiconductor layer 21 of each of the light emitting stacks may be n-type, and the second conductivity type semiconductor layer 25 may be p-type. In the first light emitting stack 320, the second light emitting stack 330, and the third light emitting stack 340, the n-type semiconductor layer and the p-type semiconductor layer may be arranged in the same sequence, but the inventive concepts are not limited thereto. For example, the first light emitting stack 320 may have a reversely stacked sequence compared to those of the second light emitting stack 330 and the third light emitting stack 340. The first, second, and third light emitting stacks 320, 330, and 340 may have a common p-type light emitting stacked structure in which the p-type semiconductor layers are commonly electrically connected, or may have a common n-type light emitting stacked structure in which the n-type semiconductor layers are commonly electrically connected.

According to the illustrated exemplary embodiment, each of the connection electrodes 350a, 350b, 350c, and 350d may have a substantially elongated shape protruding from the substrate 311. The connection electrodes 350a, 350b, 350c, and 350d may include a metal such as Cu, Ni, Ti, Sb, Zn, Mo, Co, Sn, Ag, or an alloy thereof, without being limited thereto. For example, each of the connection electrodes 350a, 350b, 350c, and 350d may include two or more metals or a plurality of different metallic layers so as to reduce stress from the elongated shape of the connection electrodes 350a, 350b, 350c, and 350d. In another exemplary embodiment, when the connection electrodes 350a, 350b, 350c, and 350d include Cu, an additional metal may be deposited or plated to suppress oxidation of Cu. In some exemplary embodiments, when the connection electrodes 350a, 350b, 350c, and 350d include Cu/Ni/Sn, Cu may prevent Sn from infiltrating into the light emitting stacked structure. In some exemplary embodiments, the connection electrodes 350a, 350b, 350c, and 350d may include a seed layer for forming a metallic layer during a plating process, which will be described later.

As shown in FIGS. 7A and 7B, each of the connection electrodes 350a, 350b, 350c, and 350d may have a substantially flat upper surface, and thus, an electrical connection between an external line or an electrode and the light emitting stacked structure may be facilitated, which will be described later. According to an exemplary embodiment of the present disclosure, when the unit pixel 100a is a micro-LED, which has a surface area less than about 10,000 µm² as known in the art, or less than about 4,000 µm² or 2,500 µm² in other exemplary embodiments, the connection electrodes 350a, 350b, 350c, and 350d may overlap a portion of at least one of the first, second, and third light emitting stacks 320, 330, and 340 as shown in FIGS. 7A and 7B. In the illustrated exemplary embodiment, the connection electrodes 350a, 350b, 350c, and 350d are illustrated as having a quadrangular pillar shape, but the present disclosure is not limited thereto. As one example, the connection electrodes 350a, 350b, 350c, and 350d may have a cylindrical shape. Furthermore, areas of lower surfaces of the connection electrodes 350a, 350b, 350c, and 350d may be larger than those of the upper surfaces thereof. For example, when the first to third light emitting stacks 320, 330, and 340 are patterned so as to form electrodes, the connection electrodes 350a, 350b, 350c and 350d may cover side surfaces of the first to third light emitting stacks 320, 330, and 340.

In general, during manufacturing, an array of a plurality of unit pixels 100a is formed on the substrate 311. The substrate 311 may be cut along scribing lines to be singularized (isolated) into each unit pixel 100a, and the unit pixel 100a may be transferred to another substrate or tape using various transferring techniques. In this case, when the unit pixel 100a includes the connection electrodes 350a, 350b, 350c, and 350d and one or more connection electrodes 350a, 350b, 350c, and 350d may have metallic bumps or pillars protruding outward, the structure in which the connection electrodes 350a, 350b, 350c, and 350d may be exposed to the outside in a transferring step. Moreover, when the unit pixel 100a includes a micro-LED, which has a surface area less than about 10,000 µm², or less than about 4,000 µm², or less than about 2,500 µm², depending upon applications, handling of the unit pixel 100a may become more difficult due to its small form factor.

For example, when the connection electrodes 350a, 350b, 350c, and 350d have a substantially elongated shape such as a rod, transferring the unit pixel 100a using a conventional vacuum method is difficult due to a protruding structure of the connection electrode due to an insufficient suction area. In addition, the exposed connection electrode may be directly affected by various stresses during subsequent processes, such as when the connection electrode is in contact with a manufacturing device, which may damage the structure of the unit pixel 100a. As another example, by attaching an adhesive tape on an upper surface (e.g., a surface opposite to the substrate 311) of the unit pixel 100a, a contact area between the unit pixel 100a and the adhesive tape may be limited to the upper surfaces of the connection electrodes 350a, 350b, 350c, and 350d when the unit pixel 100a is transferred. In this case, unlike when the adhesive tape is attached to a lower surface of the substrate, an adhesive force of the unit pixel 100a to the adhesive tape may be weakened, and the unit pixel 100a may be undesirably separated from the adhesive tape during transferring. As yet another example, when the unit pixel 100a is transferred using a conventional pick-and-place method, an ejection pin may directly contact a portion of the unit pixel 100a and damage a top structure of the light emitting structure. In particular, the ejection pin may strike a center of the unit pixel 100a, and cause physical damage to the top light emitting stack of the unit pixel 100a.

According to an exemplary embodiment of the present disclosure, the passivation layer 390 may be formed on the light emitting stacked structure. More specifically, as shown in FIG. 7A, the passivation layer 390 is formed between the connection electrodes 350a, 350b, 350c, and 350d to cover side surfaces of the connection electrodes 350a, 350b, 350c, and 350d. Furthermore, although the passivation layer 390 has described as being disposed on the light emitting stacked structure in FIGS. 7A-7B, in other forms, the passivation layer 390 may at least partially cover the side surfaces of the first to third light emitting stacks 320, 330, and 340. In that case, the side surfaces of the first to third light emitting stacks 320, 330, and 340 may not be exposed to the outside of the unit pixel 100a by being covered with the passivation layer 390 and/or another insulation layer.

The passivation layer 390 may be formed substantially flush with the upper surfaces of the connection electrodes 350a, 350b, 350c, and 350d. The passivation layer 390 may include an epoxy molding compound (EMC), which may be formed in various colors such as black, white, or transparent. However, the inventive concepts are not limited thereto. For example, in some exemplary embodiments, the passivation layer 390 may include polyimide (PID), and in this case, the PID may be provided as a dry film rather than a liquid type so as to increase a level of flatness when applied to the light emitting stacked structure. In some exemplary embodiments, the passivation layer 390 may include a photosensitive material. In this manner, the passivation layer 390 may protect the light emitting stacked structure from an external impact that may be applied during subsequent processes, as well as providing a sufficient contact area to the unit pixel 100a so as to facilitate its handling during subsequent transferring steps. In addition, the passivation layer 390 may prevent light leakage toward the side surface of the unit pixel 100a so as to prevent or at least suppress interference of light emitted from adjacent unit pixels 100a.

Figure 8:
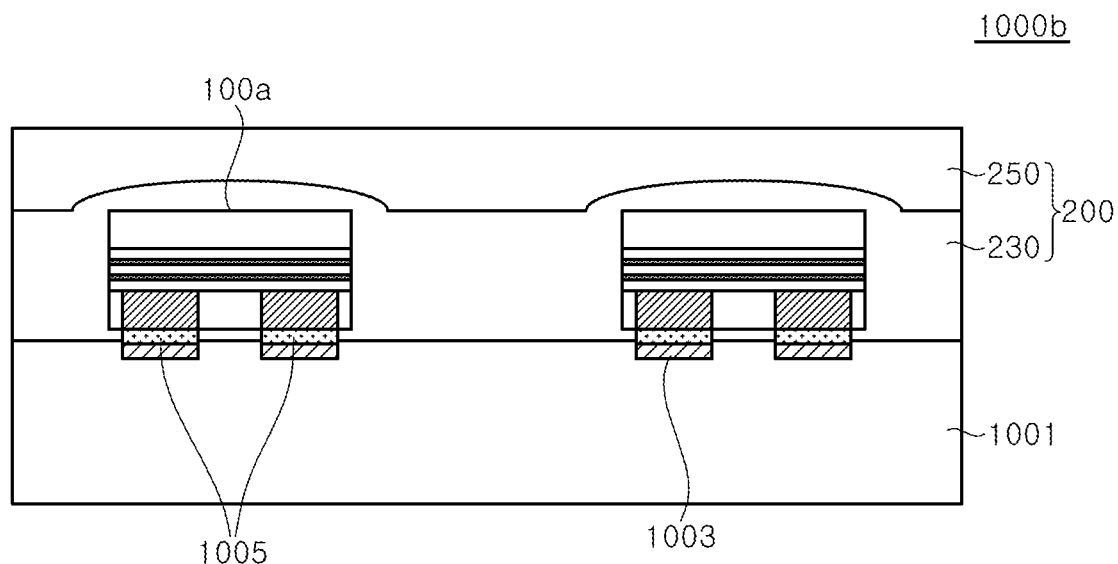
FIG. 8 is a schematic partial cross-sectional view illustrating a pixel module according to an exemplary embodiment.

FIG. 8 is a schematic cross-sectional view illustrating a pixel module 1000b according to another exemplary embodiment.

Referring to FIG. 8, the pixel module 1000b according to the present exemplary embodiment is substantially similar to the pixel module 1000 described with reference to FIGS. 5A and 5B, except that a unit pixel 100a is used instead of the unit pixel 100.

Connection electrodes 350a, 350b, 350c, and 350d of the unit pixel 100a are bonded to the pads 1003 on the circuit board 1001. As shown in FIGS. 5A and 5B, the bonding material 1005 may be disposed between the connection electrodes and the pads 1003. As shown in FIG. 8, the pads 1003 may be disposed below the upper surface of the circuit board 1001. However, the present disclosure is not limited thereto, and as shown in FIGS. 5A and 5B, the pads 1003 may protrude from the upper surface of the circuit board 1001.

Figure 9:
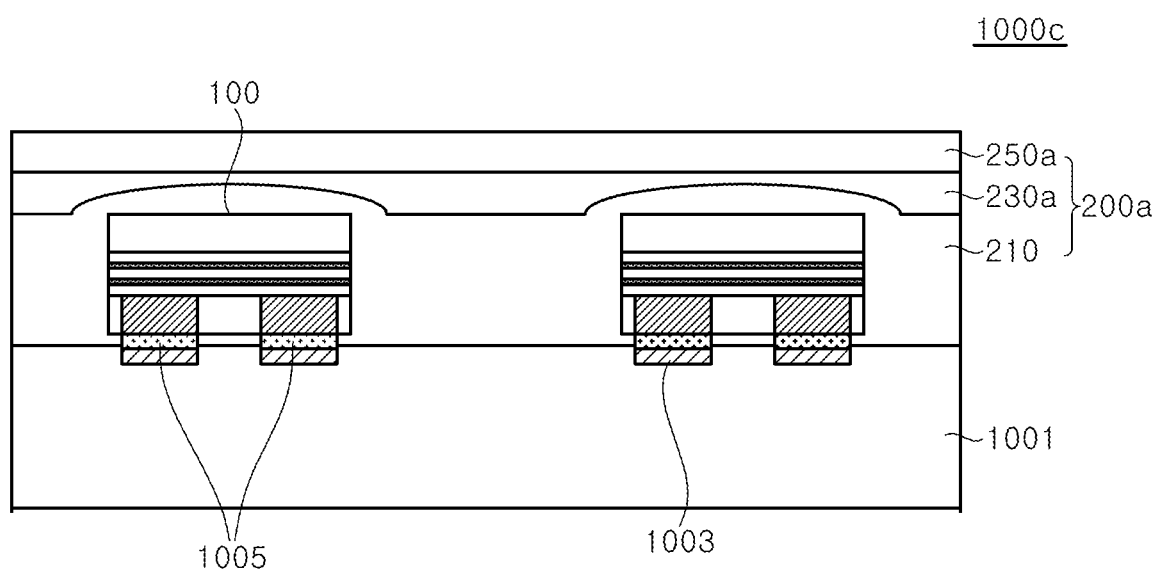
FIG. 9 is a schematic partial cross-sectional view illustrating a pixel module according to another exemplary embodiment.

FIG. 9 is a schematic cross-sectional view illustrating a pixel module 1000c according to another exemplary embodiment.

Referring to FIG. 9, the pixel module 1000c according to the present exemplary embodiment is substantially similar to the pixel module 1000b described with reference to FIG. 8, except that a molding member 200a is used instead of the molding member 200. The molding member 200a is described above with reference to FIGS. 6A and 6B.

Connection electrodes of the unit pixel 100a are bonded to the pads 1003 on the circuit board 1001. As shown in FIGS. 5A and 5B, the bonding material 1005 may be disposed between the connection electrodes and the pads 1003.

Figure 10A:
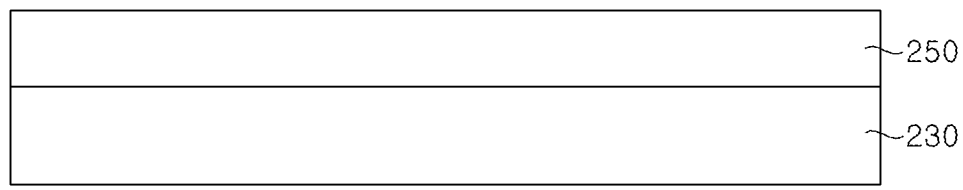
FIGS. 10A, 10B, and 10C are schematic cross-sectional views illustrating a method of manufacturing a pixel module according to an exemplary embodiment, where.
Figure 10B:
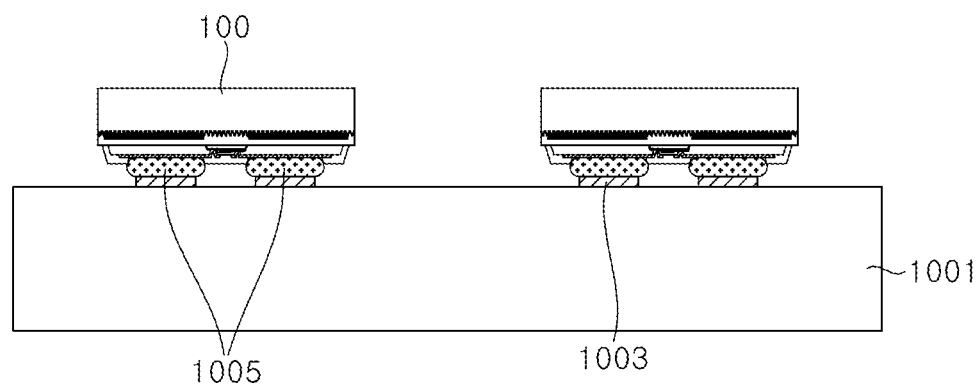
Figure 10C:
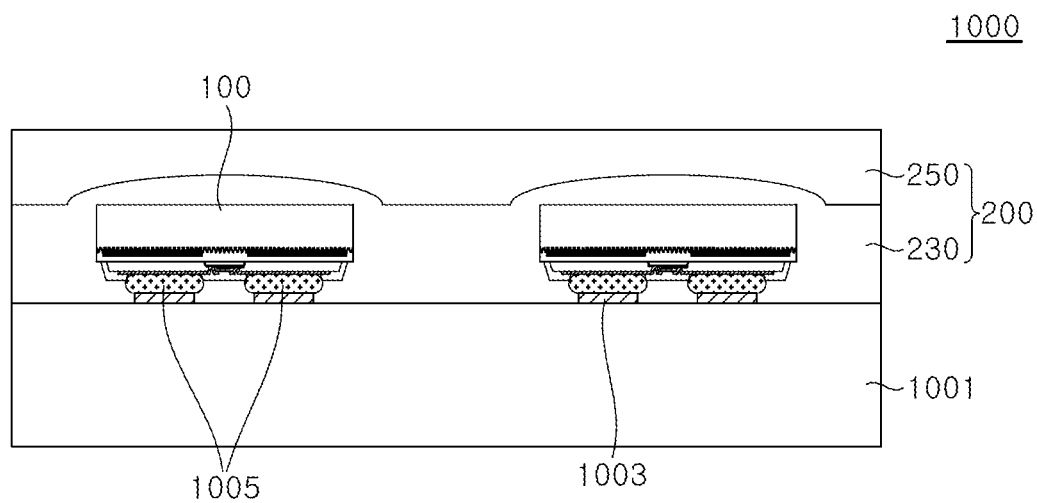

FIGS. 10A, 10B, and 10C are schematic cross-sectional views illustrating a method of manufacturing a pixel module 1000 according to an exemplary embodiment.

First, referring to FIG. 10A, the light diffusion layer 230 and the black molding layer 250 are constricted. Each of the light diffusion layer 230 and the black molding layer 250 may be formed in a form of a film, and these films may be bonded in close contact with each other. Each of the light diffusion layer 230 and the black molding layer 250 may be manufactured in the form of the film using applying and drying techniques on a temporary substrate.

Referring to FIG. 10B, unit pixels 100 are disposed on the circuit board 1001. The unit pixels 100 may be transferred to the circuit board 1001 in a group. The unit pixels 100 may be bonded to pads 1003 on the circuit board 1001 using a bonding material 1005. Although the pads 1003 are illustrated as protruding from an upper surface of the circuit board 1001 in FIGS. 10B-10C, the pads 1003 may be exposed through, for example, an opening of a solder resist. Accordingly, the pads 1003 may be placed below the upper surface of the circuit board 1001, for example, an upper surface of the solder resist. The bonding material 1005 may be disposed on each of the pads 1003, and the unit pixels 100 may be bonded to the pads 1003 by the bonding material 1005.

Referring to FIG. 10C, the light diffusion layer 230 and the black molding layer 250 described with reference to FIG. 10A cover the unit pixels 100 through a vacuum lamination process. Accordingly, the molding member 200 covering the unit pixels 100 is formed, as shown in FIG. 10C.

By using the vacuum lamination process, it is possible to easily form a uniform molding member 200 over a large area. In addition, different optical layers may be easily formed through a simple process using the vacuum lamination process. In the illustrated exemplary embodiment, although a process of forming the molding member 200 including the light diffusion layer 230 and the black molding layer 250 has been described, a molding member (200a in FIG. 6A) may be formed using the vacuum lamination process after the transparent molding layer 210, the light diffusion layer 230a, and the black molding layer 250a are constricted.

In particular, when the molding member 200 is formed using the vacuum lamination process, the light diffusion layer 230 located in an upper portion of the unit pixel 100 may have a convex shape, as shown in FIG. 10C. An upper surface of the black molding layer 250 may have a flat surface, and thus, a thickness of the black molding layer 250 located in the upper portion of the unit pixel 100 may be smaller than a thickness of the black molding layer 250 located between the unit pixels 100. In addition, as shown in FIG. 6A, when the molding member 200a is formed using the vacuum lamination process, the transparent molding layer 210 located in the upper portion of the unit pixel 100 may have a convex shape, and the light diffusion layer 230a and the black molding layer 250a may have a flat upper surface.

The present disclosure is not limited to the method of manufacturing the molding members 200 and 200a using the vacuum lamination process. For example, various techniques such as a printing technique may be used. In addition to the vacuum lamination process, when the molding members 200 and 200a are formed using a liquid material such as the printing technique, the light diffusion layer 230 or the transparent molding layer 210 located in the upper portion of the unit pixel 100 may also have a flat upper surface.

Experimental Embodiment

FIGS. 11A, 11B, 11C, 11D, and 11E are graphs illustrating a normalized light distribution of a pixel module according to structures of various molding members. Herein, the pixel modules were manufactured using unit pixels of the same stacked structure, except that molding structures were different from one another. Molding members of Comparative Example 2, Comparative Example 3, Inventive Example 1, and Inventive Example 2 below were all formed using a vacuum lamination process. For each sample, it can be determined as favorable that a viewing angle is less than 120 degrees, and a maximum value of Δu'v' in a range of left and right +−45 degree is less than 0.01.

Figure 11A:
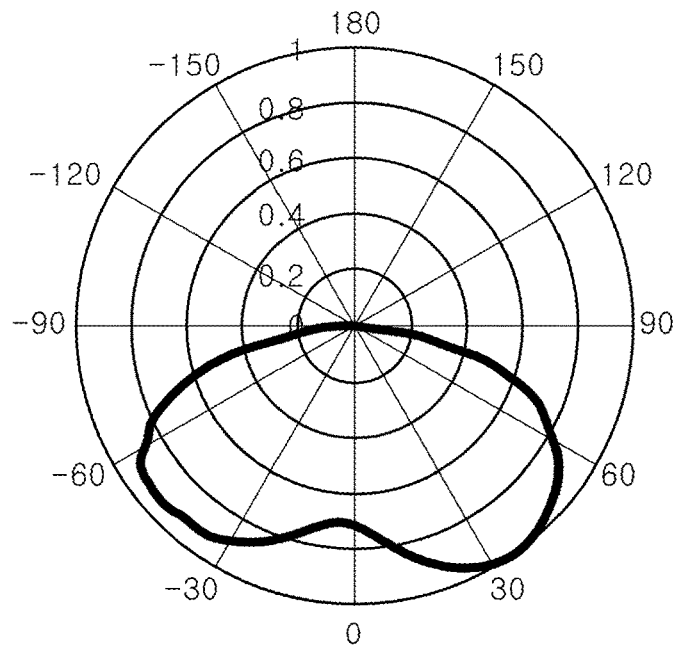
FIGS. 11A, 11B, 11C, 11D, and 11E are graphs illustrating normalized light distribution of a pixel module according to structures of various molding members, where.
Figure 11B:
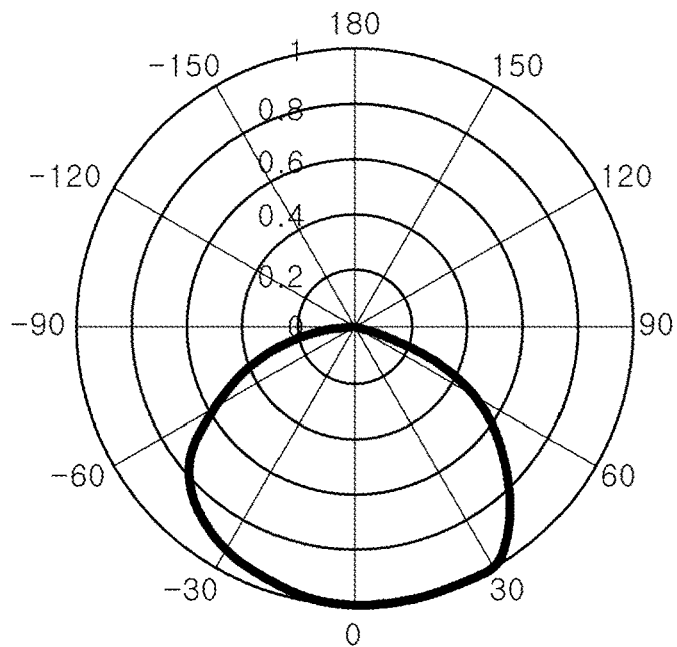
Figure 11C:
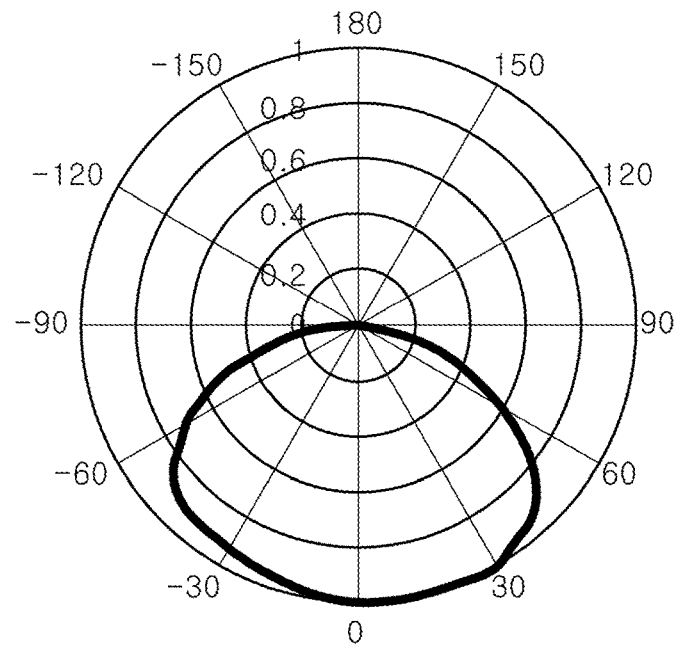
Figure 11D:
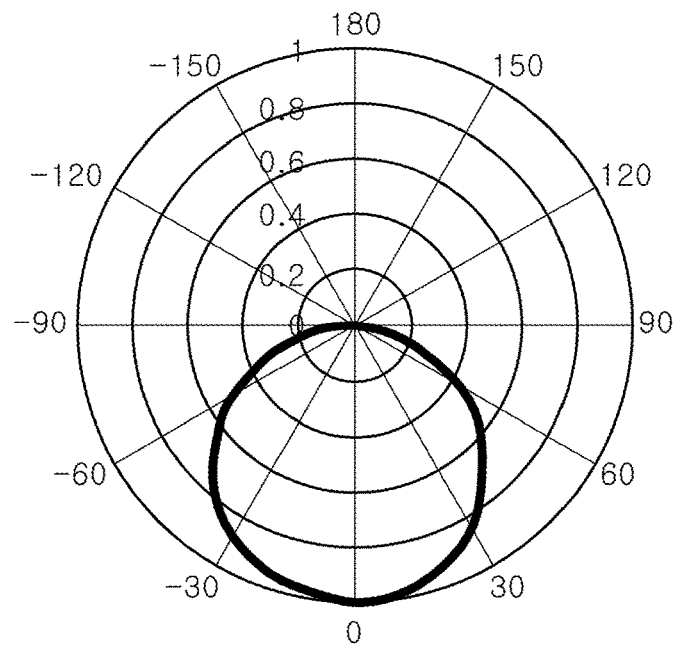
Figure 11E:
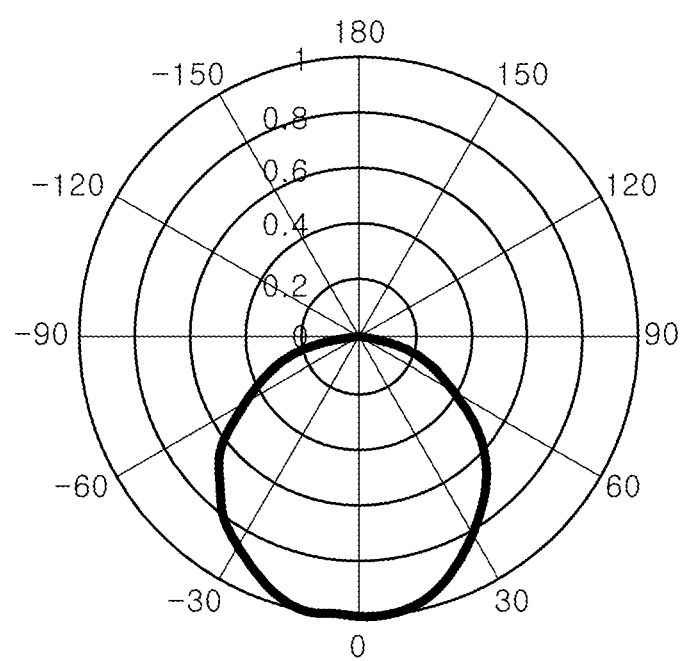

A molding member was not formed in Comparative Example 1 (FIG. 11A), and a single layer of a black molding layer containing 0.2 wt % based on a total weight of a molding member was formed to have a thickness of about 220 μm in Comparative Example 2 (FIG. 11B). In Comparative Example 3 (FIG. 11C), a molding member was formed using 150 μm of a transparent molding layer and 50 μm of a black molding layer containing 0.2 wt % carbon black.

Meanwhile, in Inventive Example 1 (FIG. 11D), 150 μm of a light diffusion layer containing about 0.7 wt % of $TiO_2$ particles and 50 μm of a black molding layer containing 0.2 wt % of carbon black were used, and in Inventive Example 2 (FIG. 11E), 150 μm of a light diffusion layer containing about 1.0 wt % of $TiO_2$ particles and 50 μm of a black molding layer containing 0.2 wt % of carbon black were used.

In Comparative Example 1 (FIG. 11A), a viewing angle was relatively wide at about 154.4 degrees, and a maximum Δu'v' at +−45 degrees was significantly high as 0.043, indicating a large color deviation.

Meanwhile, in Comparative Example 2 (FIG. 11B), a viewing angle was about 132.0 degrees which is smaller compared to that of Comparative Example 1 in which the molding member was not formed, and a maximum Δu'v' at +−45 degrees was 0.023 which was smaller than that of Comparative Example 1, but a color deviation thereof was still quite high.

Comparative Example 3 (FIG. 11C) had a viewing angle of about 131.4 degrees, and a maximum Δu'v' at +−45 degrees was 0.018, which was improved compared to Comparative Example 2, but the viewing angle was still relatively wide and a color deviation thereof was quite high.

Meanwhile, Inventive Example 1 (FIG. 11D) had a viewing angle of about 111.4 degrees, and a maximum Δu'v' at +−45 degrees was 0.007, which had significantly improved viewing angle and color deviation compared to those of Comparative Examples 1 to 3. In particular, the maximum Δu'v' at +−45 degrees indicating color deviation is less than 0.01, and thus, it can be seen that the color deviation is significantly reduced.

Inventive Example 2 (FIG. 11E) had a viewing angle of about 110.9 degrees, and a maximum Δu'v' at +−45 degrees was 0.006, which had significantly improved viewing angle and color deviation compared to those of Comparative Examples 1 to 3. In particular, the maximum Δu'v' at +−45 degrees indicating color deviation is less than 0.01, and thus, it can be seen that the color deviation is significantly reduced.

As it can be seen from the above experiment, the viewing angle and the color deviation may be reduced by using the molding member including the light diffusion layer and the black molding layer.

Although some embodiments have been described herein, it should be understood that these embodiments are provided for illustration only and are not to be construed in any way as limiting the present disclosure. It should be understood that features or components of an exemplary embodiment can also be applied to other embodiments without departing from the spirit and scope of the present disclosure.

The invention claimed is:

1. A pixel module, comprising:
   a circuit board;
   unit pixels arranged on the circuit board; and
   a molding layer covering the unit pixels,
   wherein the molding layer includes a light diffusion layer and a black molding layer covering the light diffusion layer such that the molding layer is disposed between the unit pixels, and
   wherein the light diffusion layer comprises a first region having a first thickness and disposed between the unit pixels and the black molding layer comprises a second region having a second thickness and disposed on the light diffusion layer, the second thickness being smaller than the first thickness, and
   wherein a maximum value of Δu'v' that is indicative of color deviation of the pixel module and in a range of +−45 degree is equal to or less than 0.01.

2. The pixel module of claim 1,
   wherein the light diffusion layer includes a transparent matrix having light diffusion particles dispersed therein and the light diffusion particles include silica or $TiO_2$ particles.

3. The pixel module of claim 1,
   wherein the black molding layer includes a light absorbing material in a matrix.

4. The pixel module of claim 3,
   wherein the light absorbing material include carbon black.

5. The pixel module of claim 4,
   wherein the carbon black is coated on surfaces of organic or inorganic particles dispersed in the matrix of the black molding layer.

6. The pixel module of claim 5,
   wherein the inorganic particles dispersed in the matrix of the black molding layer include silica or $TiO_2$.

7. The pixel module of claim 3,
   wherein the black molding layer includes a plurality of layers having different concentrations of the light absorbing material.

8. The pixel module of claim 7,
   wherein the plurality of layers further includes a first layer and a second layer, and
   the first layer having a higher concentration of light absorbing material than the second layer and the second layer is disposed further apart from the light diffusion layer than the first layer is.

9. The pixel module of claim 3, wherein a concentration of the light absorbing material in the black molding layer is gradually decreased from the light diffusion layer in a thickness direction of the black molding layer.

10. The pixel module of claim 1, wherein:
the molding layer further includes a transparent molding layer on which the light diffusion layer is disposed and the black molding layer is disposed on the light diffusion layer; and
the transparent molding layer is further disposed between the unit pixels and the light diffusion layer.

11. The pixel module of claim 10, wherein:
the light diffusion layer and the black molding layer are disposed in an upper region of two neighboring unit pixels among the unit pixels and in a region between the two neighboring unit pixels; and
the light diffusion layer and the black molding layer in the upper region are configured to be thinner than the light diffusion layer and the black molding layer in the region between the two neighboring unit pixels.

12. The pixel module of claim 1, wherein a unit pixel of the unit pixels comprises at least three light emitting devices disposed adjacent to one another and the at least three light emitting devices are arranged side by side.

13. The pixel module of claim 12, wherein the unit pixel of the unit pixels further comprises a step adjustment layer disposed between the at least three light emitting devices.

14. The pixel module of claim 1, wherein a thickness of the light diffusion layer, a thickness of the black molding layer, or both thicknesses of the light diffusion layer and the black molding layer vary along a lateral direction of the circuit board.

15. The pixel module of claim 14, wherein the black molding layer is arranged in an upper region of a selected unit pixel of the unit pixels and in a region between the selected unit pixel and a neighboring unit pixel, and the thickness of the black molding layer is smaller than the black molding layer arranged in the region between the selected unit pixel and the neighboring unit pixel.

16. The pixel module of claim 15, further comprising:
a protection layer; and
a plurality of connection electrodes; and
wherein an upper surface of the protection layer and upper surfaces of the plurality of connection electrodes are flush with one another.

17. The pixel module of claim 1, wherein the molding layer has a thickness within a range of 50 μm to 400 μm.

18. The pixel module of claim 1, wherein the molding layer is formed through a vacuum lamination technique using a film including the light diffusion layer and the black molding layer.

19. A display apparatus, comprising:
a panel substrate; and
pixel modules disposed on the panel substrate,
each of the pixel modules comprising:
  a circuit board;
  unit pixels arranged on the circuit board; and
  a molding layer covering the unit pixels such that the molding layer is disposed between and on or above the unit pixels,
  wherein the molding layer includes a light diffusion layer and a black molding layer the light diffusion layer comprising a first region having a first thickness that is disposed on one of the unit pixels and the black molding layer including a second region having a second thickness that is disposed between the unit pixels,
  wherein the first thickness is greater than the second thickness, and
  wherein a maximum value of Δu'v' that is indicative of color deviation of a pixel module and in a range of +−45 degree is equal to or less than 0.01.

20. The display apparatus of claim 19, wherein the molding layer has a thickness within a range between 50 μm and 400 μm.

* * * * *